(12) United States Patent  
Yoo et al.

(10) Patent No.: US 12,142,631 B2  
(45) Date of Patent: Nov. 12, 2024

(54) LIGHT EMITTING DIODE AND DISPLAY DEVICE INCLUDING THE SAME

(71) Applicant: Samsung Display Co., LTD., Yongin-si (KR)

(72) Inventors: Chul Jong Yoo, Yongin-si (KR); Dong Uk Kim, Yongin-si (KR); Se Young Kim, Yongin-si (KR); So Young Lee, Yongin-si (KR); Hyung Rae Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 523 days.

(21) Appl. No.: 17/401,713

(22) Filed: Aug. 13, 2021

(65) Prior Publication Data

US 2022/0190025 A1 Jun. 16, 2022

(30) Foreign Application Priority Data

Dec. 15, 2020 (KR) .......................... 10-2020-0175873

(51) Int. Cl.
| | |
|---|---|
| *H01L 27/15* | (2006.01) |
| *H01L 33/00* | (2010.01) |
| *H01L 33/14* | (2010.01) |
| *H01L 33/24* | (2010.01) |
| *H01L 33/32* | (2010.01) |

(Continued)

(52) U.S. Cl.
CPC ........ *H01L 27/156* (2013.01); *H01L 33/0075* (2013.01); *H01L 33/0093* (2020.05); *H01L 33/145* (2013.01); *H01L 33/24* (2013.01); *H01L 33/32* (2013.01); *H01L 33/36* (2013.01);

(Continued)

(58) Field of Classification Search
CPC ......... H01L 33/44; H01L 33/36; H01L 33/32; H01L 33/24; H01L 33/145; H01L 27/156
See application file for complete search history.

(56) References Cited

U.S. PATENT DOCUMENTS

| | | |
|---|---|---|
| 7,989,244 B2 | 8/2011 | Kim et al. |
| 9,112,112 B2 | 8/2015 | Do et al. |

(Continued)

FOREIGN PATENT DOCUMENTS

| | | |
|---|---|---|
| JP | 4168497 | 10/2018 |
| KR | 10-0697666 | 3/2007 |

(Continued)

OTHER PUBLICATIONS

International Search Report corresponding to International Application No. PCT/KR2021/015134 dated Feb. 7, 2022.

*Primary Examiner* — Mark W Tornow  
(74) *Attorney, Agent, or Firm* — KILE PARK REED & HOUTTEMAN PLLC

(57) ABSTRACT

A light emitting diode includes a first end and a second end facing each other, a current blocking layer, a first semiconductor layer, an active layer, a second semiconductor layer, and an insulating film surrounding outer circumferential surfaces of the first semiconductor layer, the active layer, and the second semiconductor layer and exposing at least a portion of the current blocking layer and at least a portion of the first semiconductor layer at the second end. The current blocking layer, the first semiconductor layer, the active layer, and the second semiconductor layer are sequentially disposed in a direction from the second end to the first end.

19 Claims, 22 Drawing Sheets

(51) Int. Cl.
*H01L 33/36* (2010.01)
*H01L 33/44* (2010.01)

(52) U.S. Cl.
CPC ...... *H01L 33/44* (2013.01); *H01L 2933/0016* (2013.01); *H01L 2933/0025* (2013.01)

(56) References Cited

U.S. PATENT DOCUMENTS

| | | |
|---|---|---|
| 10,026,777 B2 | 7/2018 | Kang et al. |
| 11,069,829 B2 | 7/2021 | Min et al. |
| 2011/0254043 A1* | 10/2011 | Negishi ............... H01L 33/20 438/22 |
| 2013/0221385 A1* | 8/2013 | Shibata ............... H01L 33/64 438/33 |
| 2018/0019369 A1* | 1/2018 | Cho ................. H05K 1/181 |
| 2019/0115513 A1* | 4/2019 | Im ..................... H01L 33/06 |
| 2019/0378954 A1* | 12/2019 | Min ..................... H01L 33/30 |
| 2020/0091388 A1* | 3/2020 | Chaji ............... H01L 33/0075 |
| 2020/0152835 A1 | 5/2020 | Ko et al. |
| 2021/0057607 A1* | 2/2021 | Lin ................. H01L 25/167 |
| 2021/0202450 A1 | 7/2021 | Min et al. |

FOREIGN PATENT DOCUMENTS

| | | |
|---|---|---|
| KR | 10-0755656 | 9/2007 |
| KR | 10-1238169 | 2/2013 |
| KR | 10-1244926 | 3/2013 |
| KR | 10-2018-0071465 | 6/2018 |
| KR | 10-2019-0140542 | 12/2019 |
| KR | 10-2020-0029100 | 3/2020 |
| KR | 10-2020-0053726 | 5/2020 |

\* cited by examiner

LIGHT EMITTING DIODE AND DISPLAY DEVICE INCLUDING THE SAME

CROSS-REFERENCE TO RELATED APPLICATION

This application claims priority to and the benefit of Korean Patent Application No. 10-2020-0175873 under 35 U.S.C. § 119, filed in the Korean Intellectual Property Office (KIPO) on Dec. 15, 2020, the entire contents of which are incorporated herein by reference.

BACKGROUND

1. Technical Field

The disclosure relates to a light emitting diode and a display device including the same.

2. Description of the Related Art

Recently, interest in information display has been increasing. Accordingly, research and development on display devices are continuously being conducted.

SUMMARY

An object of the disclosure is to provide a light emitting diode, which can be stably separated from a manufacturing substrate, and a display device including the same.

The objects of the disclosure are not limited to the above object, and other objects that are not mentioned herein will be clearly understood by those of ordinary skill in the art from the following description.

A light emitting diode according to an embodiment of the disclosure may include a first end and a second end facing each other; a current blocking layer, a first semiconductor layer, an active layer, a second semiconductor layer; and an insulating film surrounding outer circumferential surfaces of the first semiconductor layer, the active layer, and the second semiconductor layer and exposing at least a portion of the current blocking layer and at least a portion of the first semiconductor layer at the second end. The current blocking layer, the first semiconductor layer, the active layer, and the second semiconductor layer may be sequentially disposed in a direction from the second end to the first end.

In an embodiment, the first semiconductor layer may include a first conductivity-type semiconductor doped to have a first concentration, and the current blocking layer may include a first conductivity-type semiconductor doped to have a concentration lower than the first concentration, or include an undoped intrinsic semiconductor.

In an embodiment, the first semiconductor layer and the current blocking layer may include a same semiconductor material.

In an embodiment, the second semiconductor layer may include a second conductivity-type semiconductor.

In an embodiment, the first semiconductor layer may include an N-type semiconductor, and the second semiconductor layer may include a P-type semiconductor.

In an embodiment, the current blocking layer, the first semiconductor layer, and the second semiconductor layer may include a nitride-based semiconductor material.

In an embodiment, the current blocking layer may include an insulating material.

In an embodiment, the light emitting diode may further include: a rod-shaped light emitting body including the current blocking layer, the first semiconductor layer, the active layer, the second semiconductor layer, and two bottom surfaces corresponding to the first end and the second end. The insulating film may overlap a side circumferential area of the light emitting body except for a ring-shaped outer circumferential surface corresponding to at least a portion of the current blocking layer and at least a portion of the first semiconductor layer.

In an embodiment, the light emitting diode may further include an electrode layer disposed at the first end and is adjacent to the second semiconductor layer.

In an embodiment, the insulating film may expose the second semiconductor layer or an electrode layer adjacent to the second semiconductor layer at the first end.

A display device according to an embodiment of the disclosure may include a pixel disposed in a display area, wherein the pixel may include a first electrode and a second electrode spaced apart from each other; a light emitting diode disposed between the first electrode and the second electrode, the light emitting diode including a current blocking layer, a first semiconductor layer, an active layer, and a second semiconductor layer, wherein the current blocking layer, the first semiconductor layer, the active layer, and the second semiconductor layer are sequentially disposed in a direction from a second end adjacent to the second electrode to a first end adjacent to the first electrode; a first contact electrode electrically connected to the second semiconductor layer; and a second contact electrode electrically connected to the first semiconductor layer.

In an embodiment, the light emitting diode may further include an insulating film surrounding outer circumferential surfaces of the first semiconductor layer, the active layer, and the second semiconductor layer and exposing at least a portion of the current blocking layer and at least a portion of the first semiconductor layer at the second end.

In an embodiment, the second contact electrode may contact the exposed surface of the first semiconductor layer and may be electrically connected to the first semiconductor layer.

In an embodiment, the light emitting diode may include a rod-shaped light emitting body including the current blocking layer, the first semiconductor layer, the active layer, the second semiconductor layer, and two bottom surfaces corresponding to the first end and the second end, and the insulating film may overlap a side circumferential area of the light emitting body except for a ring-shaped outer circumferential surface corresponding to at least a portion of the current blocking layer and at least a portion of the first semiconductor layer.

In an embodiment, the insulating film may expose the second semiconductor layer or an electrode layer adjacent to the second semiconductor layer at the first end, and the first contact electrode may contact the second semiconductor layer or the exposed surface of the electrode layer at the first end and may be electrically connected to the second semiconductor layer.

In an embodiment, the first semiconductor layer may include a first conductivity-type semiconductor doped to have a first concentration, and the current blocking layer may include a first conductivity-type semiconductor doped to have a concentration lower than the first concentration, or includes an undoped intrinsic semiconductor.

In an embodiment, the second semiconductor layer may include a second conductivity-type semiconductor.

In an embodiment, the first semiconductor layer may include an N-type semiconductor, and the second semiconductor layer may include a P-type semiconductor.

In an embodiment, the current blocking layer, the first semiconductor layer, and the second semiconductor layer may include a nitride-based semiconductor material.

In an embodiment, the current blocking layer may include an insulating material.

Specific matters of other embodiments are included in the detailed description and drawings.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
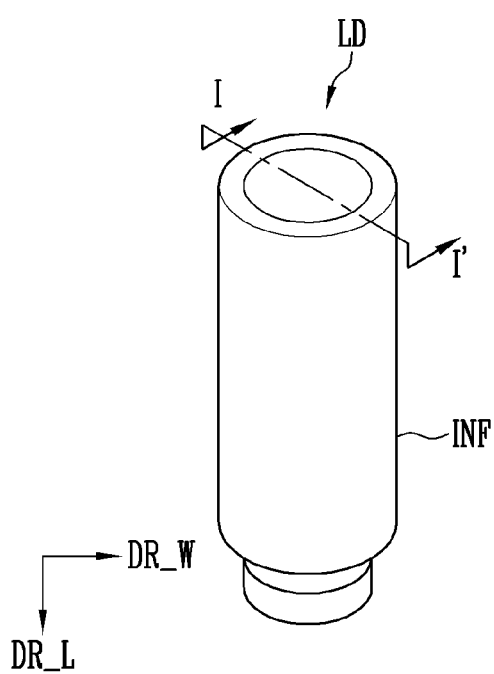
FIG. 1 is a perspective view schematically illustrating a light emitting diode according to an embodiment of the disclosure.

As the description allows for various changes and numerous embodiments, certain embodiments will be illustrated in the drawings and described in detail in the written description. The singular forms "a," "an," and "the" as used herein are intended to include the plural meanings as well unless the context clearly indicates otherwise.

However, the disclosure is not limited to the following embodiments and may be embodied in various forms. In addition, each of the embodiments disclosed below may be implemented alone, or may be implemented in combination with at least one other embodiment.

In the drawings, some elements that are not directly related to the features of the disclosure may be omitted to clearly illustrate the disclosure. In addition, some elements in the drawings may be somewhat exaggerated in size or ratio. The same reference numerals and symbols are assigned to the same or similar elements throughout the drawings even when they are illustrated on different drawings, and repetitive descriptions thereof will be omitted.

The phrase "at least one of" is intended to include the meaning of "at least one selected from the group of" for the purpose of its meaning and interpretation. For example, "at least one of A and B" may be understood to mean "A, B, or A and B."

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2A:
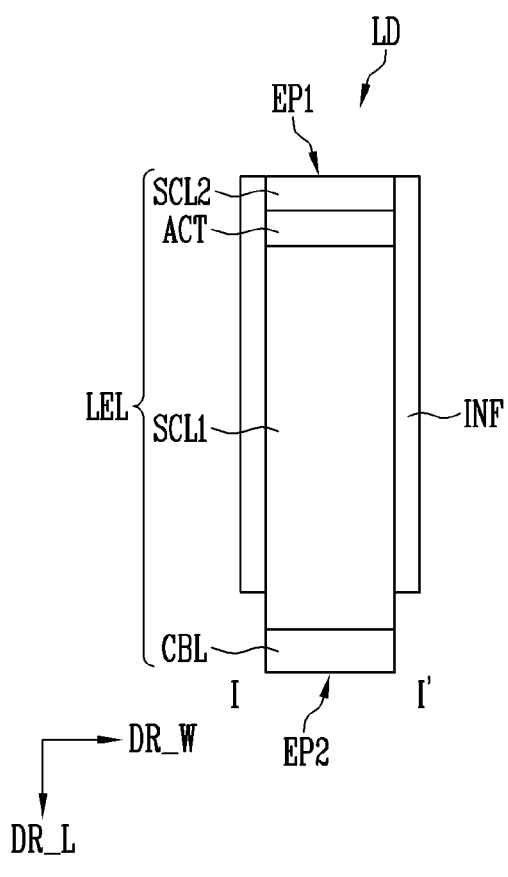
FIGS. 2A and 2B are cross-sectional views schematically illustrating a light emitting diode according to an embodiment of the disclosure.
Figure 2B:
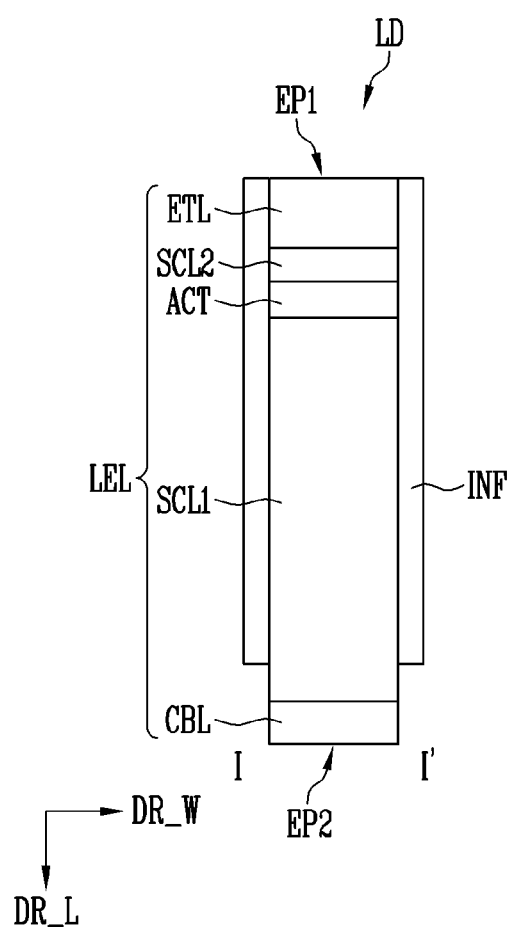
Figure 3A:
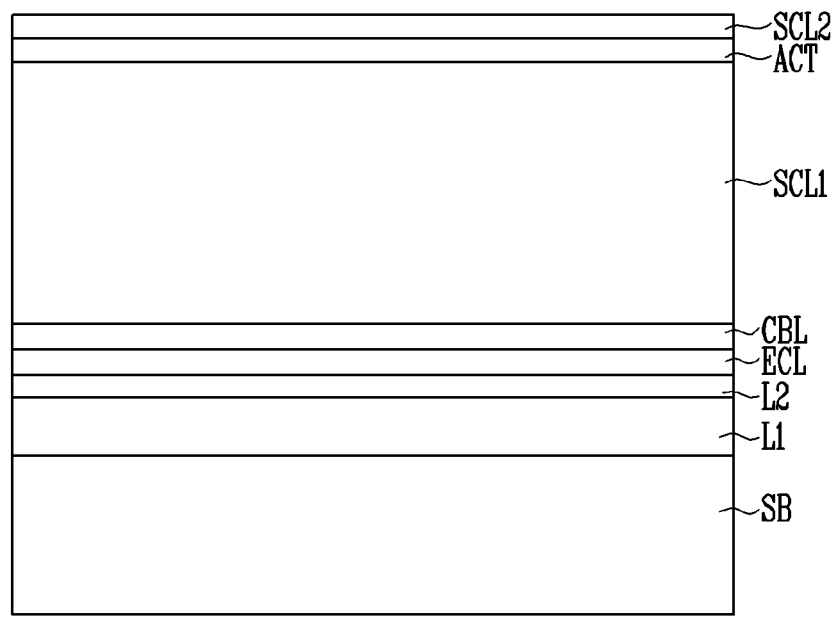
FIGS. 3A to 3H are cross-sectional views schematically illustrating a method of manufacturing a light emitting diode according to an embodiment of the disclosure.
Figure 3B:
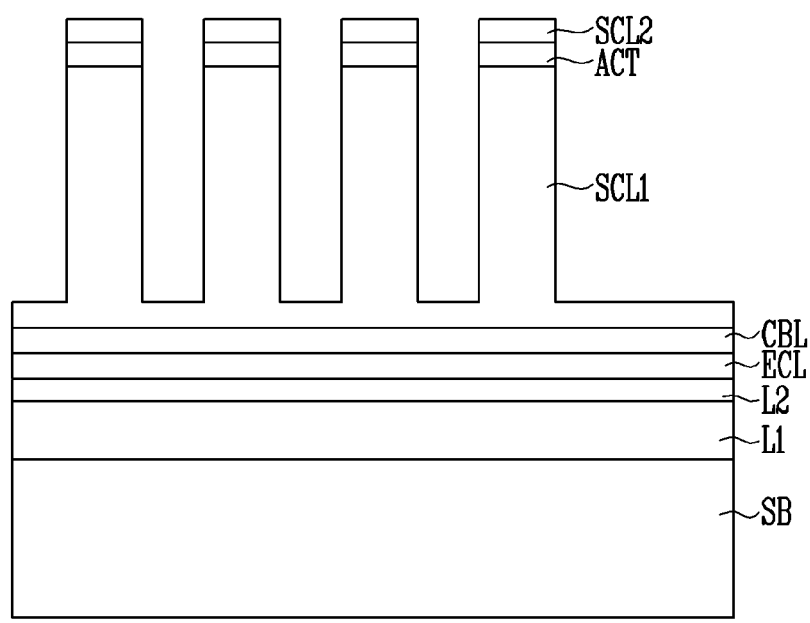
Figure 3C:
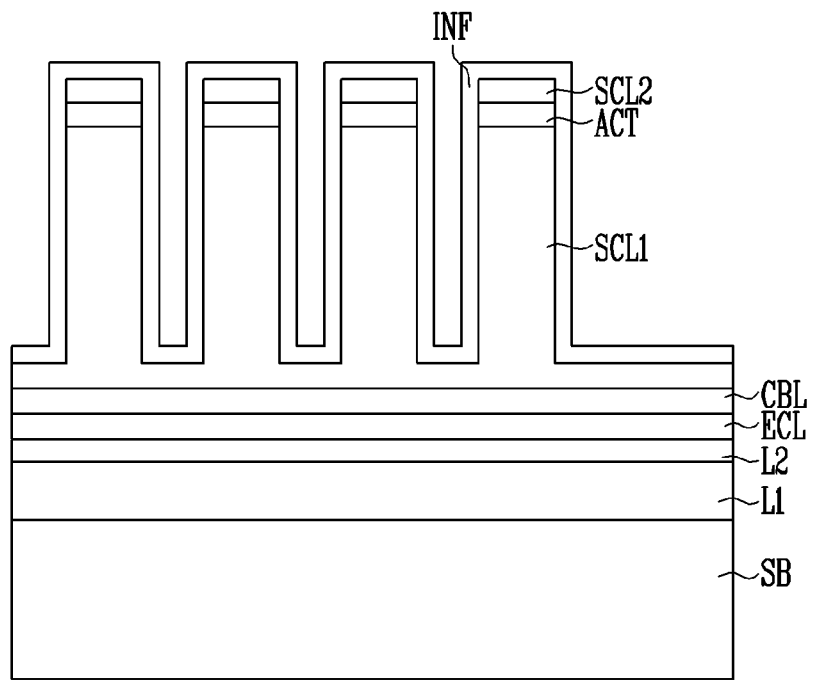
Figure 3D:
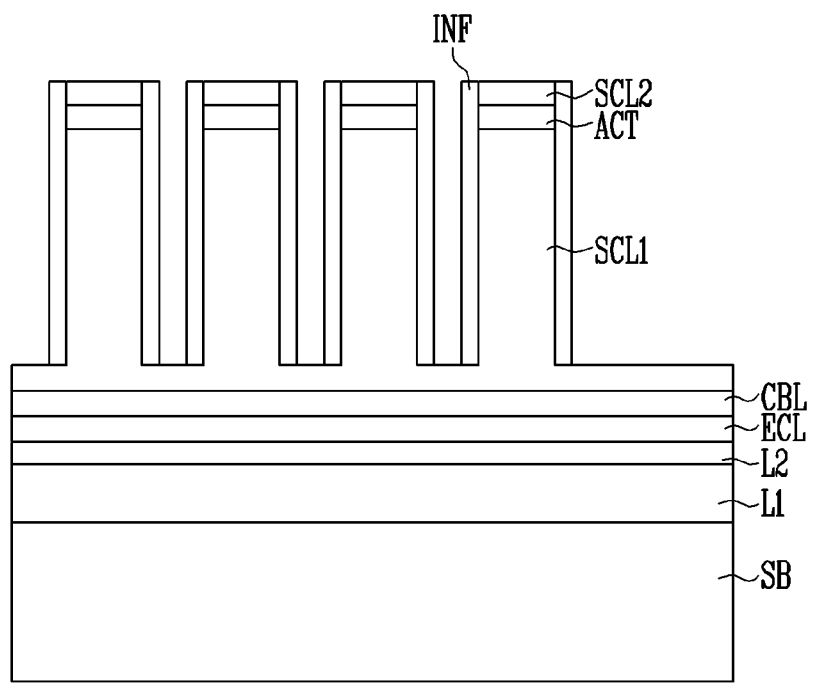
Figure 3E:
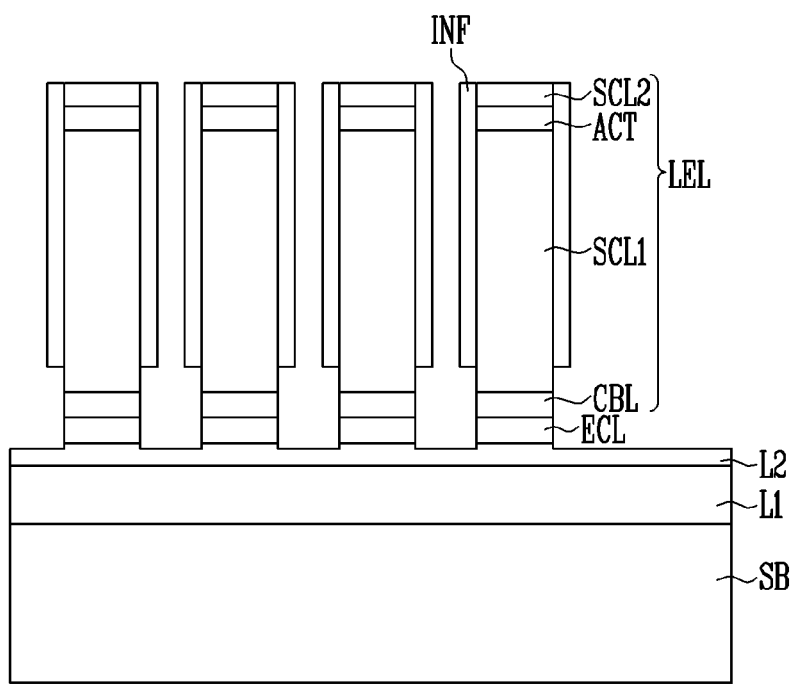
Figure 3F:
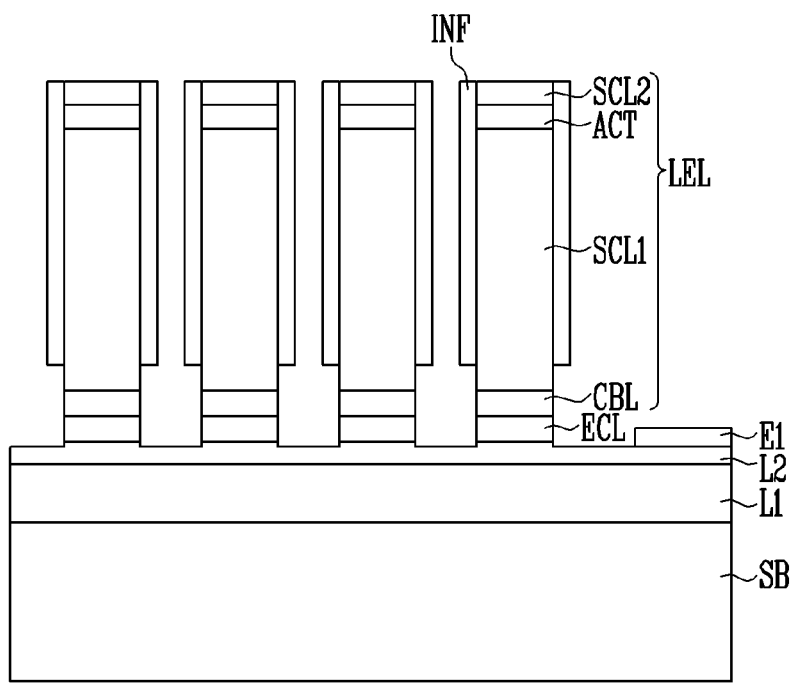
Figure 3G:
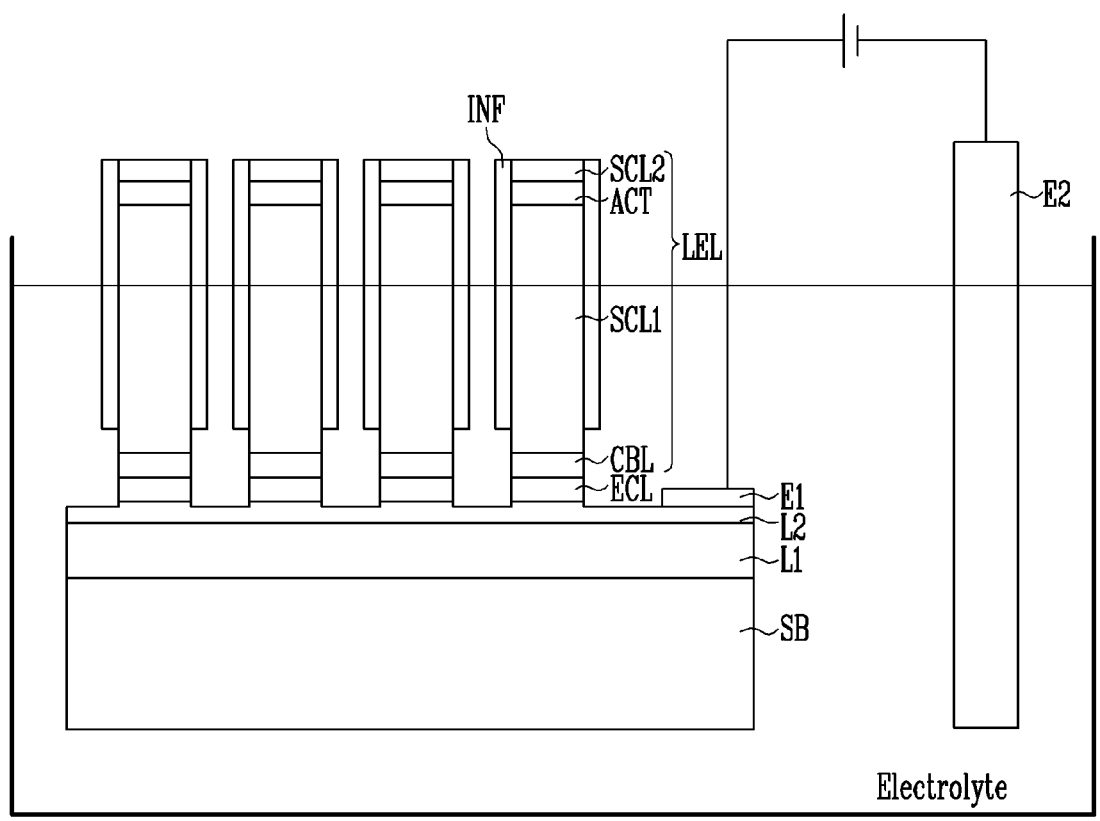
Figure 3H:
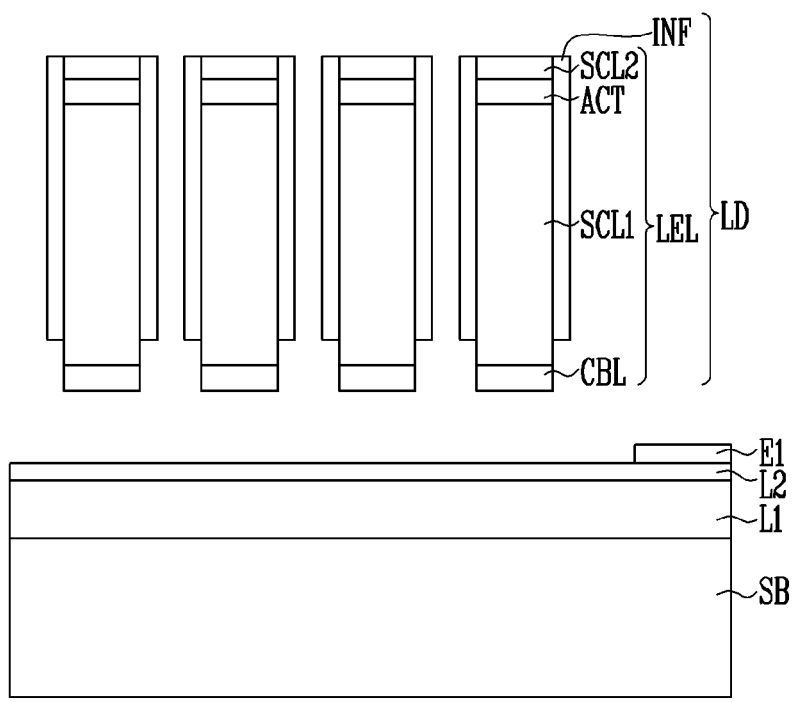
Figure 4A:
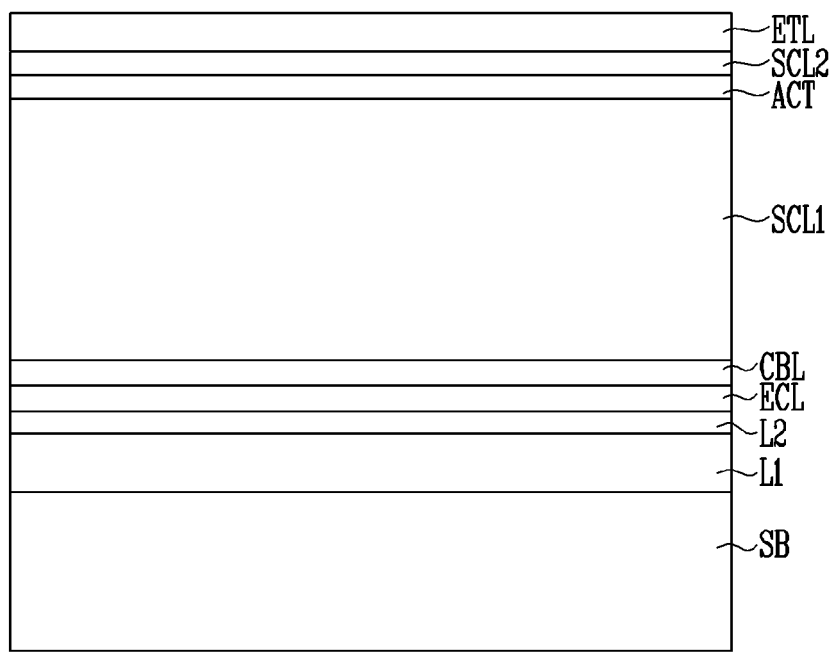
FIGS. 4A to 4D are cross-sectional views schematically illustrating a method of manufacturing a light emitting diode according to an embodiment of the disclosure.
Figure 4B:
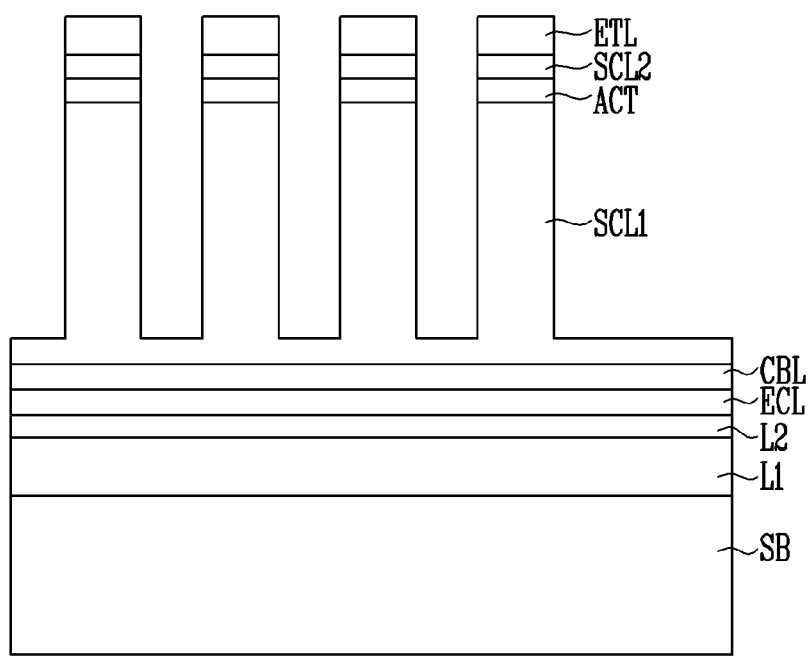
Figure 4C:
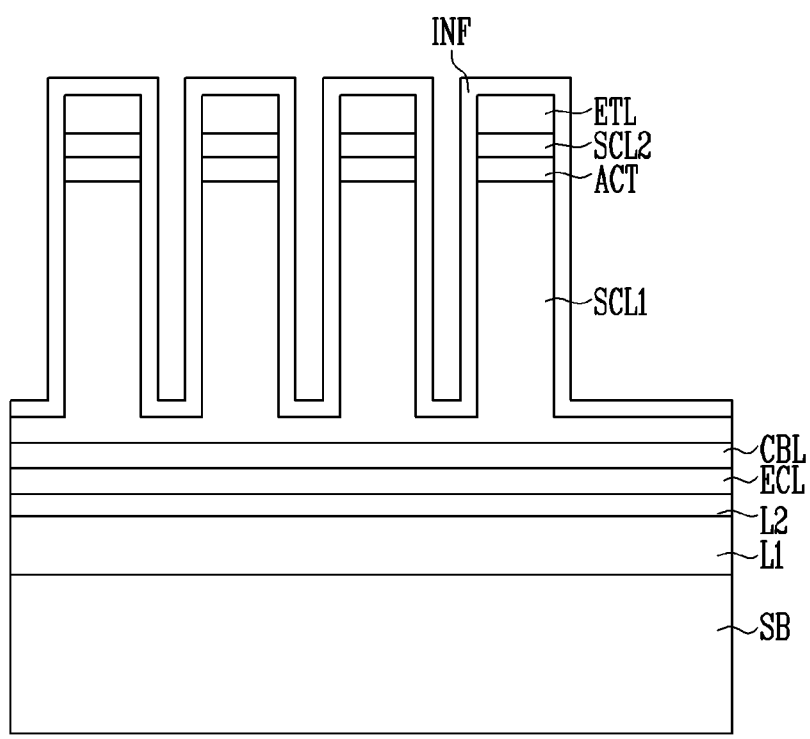
Figure 4D:
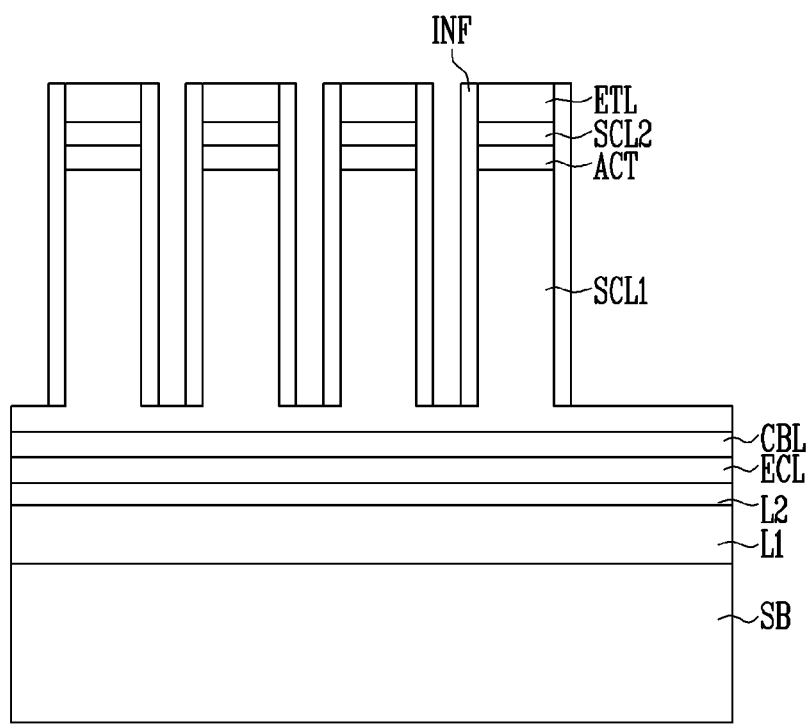

FIG. 1 is a schematic perspective view illustrating a light emitting diode LD according to an embodiment. FIGS. 2A and 2B are schematic cross-sectional views illustrating the light emitting diode LD according to an embodiment. For example, FIGS. 2A and 2B illustrate different embodiments of the cross-section of the light emitting diode LD taken along line I-I' of FIG. 1. Compared with the embodiment of FIG. 2A, the light emitting diode LD according to the embodiment of FIG. 2B further includes an electrode layer ETL positioned at a first end EP1.

Referring first to FIGS. 1 and 2A, the light emitting diode LD may be provided in a rod shape extending in a direction and may include a first end EP1 and a second end EP2 facing each other. For example, the light emitting diode LD may include the first end EP1 and the second end EP2 positioned at both ends thereof in a length direction DR_L (or in a thickness direction). In an embodiment, the first end EP1 may include a first bottom surface (or top surface) of the light emitting diode LD and/or a peripheral area (or peripheral portion) thereof (e.g., a portion in which a second semiconductor layer SCL2 is positioned), and the second end EP2 may include a second bottom surface (or lower surface) of the light emitting diode LD and/or a peripheral portion thereof (e.g., a portion in which a current blocking layer CBL and a first semiconductor layer SCL1 adjacent to the current blocking layer CBL are positioned).

In describing embodiments, the rod shape refers to a rod-like shape or a bar-like shape that is long in the length direction DR_L (i.e., an aspect ratio being greater than 1), such as a cylinder or a polyprism, and the shape of the cross-section thereof is not particularly limited. For example, the length of the light emitting diode LD may be greater than the diameter thereof (or the width of the cross-section) in a width direction DR_W.

The light emitting diode LD may include the current blocking layer CBL, the first semiconductor layer SCL1, an active layer ACT, and the second semiconductor layer SCL2, which are sequentially disposed and/or stacked in a direction. For example, the light emitting diode LD may include the current blocking layer CBL, the first semiconductor layer SCL1, the active layer ACT, and the second semiconductor layer SCL2, which are sequentially stacked and/or disposed in a direction from the second end EP2 to the first end EP1. The current blocking layer CBL may be disposed at the second end EP2 of the light emitting diode LD, and the second semiconductor layer SCL2 may be disposed at the first end EP1 of the light emitting diode LD.

The current blocking layer CBL, the first semiconductor layer SCL1, the active layer ACT, and the second semiconductor layer SCL2 may constitute a stack-type and/or rod-shaped light emitting body LEL. For example, the light emitting body LEL may have a rod shape that includes the current blocking layer CBL, the first semiconductor layer SCL1, the active layer ACT, and the second semiconductor layer SCL2, which are sequentially stacked in the length direction DR_L, and two bottom surfaces corresponding to the first end EP1 and the second end EP2 of the light emitting diode LD.

On the other hand, in describing the embodiments, the current blocking layer CBL has been described as an element included in the light emitting body LEL, but the disclosure is not limited thereto. For example, the current blocking layer CBL may be regarded as a separate element from the light emitting body LEL. The current blocking layer CBL may be considered as being positioned at an end of the light emitting body LEL.

The light emitting diode LD may further include an insulating film INF that surrounds the outer circumferential surface of the light emitting body LEL (e.g., the side surface of the cylinder) and exposes a portion of the light emitting body LEL at the first end EP1 and the second end EP2. For example, the insulating film INF may expose a portion of the light emitting body LEL so that the light emitting diode LD may be electrically connected to an electrode or a line at the first and second ends EP1 and EP2.

For example, the insulating film INF may surround the outer circumferential surfaces (e.g., the side circumferences) of the first semiconductor layer SCL1, the active layer ACT, and the second semiconductor layer SCL2. The insulating film INF may expose a portion (e.g., the upper surface) of the second semiconductor layer SCL2 at the first end EP1 and may expose the current blocking layer CBL and a portion of the first semiconductor layer SCL1 at the second end EP2. For example, the insulating film INF may surround a side circumferential portion of the light emitting body LEL except for a ring-shaped outer circumferential surface corresponding to an area of the current blocking layer CBL and the portion of the first semiconductor layer SCL1. According to an embodiment, the insulating film INF may at least partially expose the ring-shaped outer circumferential surface corresponding to an area of the second semiconductor layer SCL2 even at the first end EP1.

Referring to FIGS. 1, 2A, and 2B, the light emitting diode LD may further include an electrode layer ETL disposed on the second semiconductor layer SCL2. For example, the light emitting diode LD does not include the electrode layer ETL as illustrated in FIG. 2A or may include the electrode layer ETL positioned at the first end EP1 so as to be adjacent to the second semiconductor layer SCL2 as illustrated in FIG. 2B. The electrode layer ETL may be disposed at the first end EP1 of the light emitting diode LD, and the current blocking layer CBL may be disposed at the second end EP2 of the light emitting diode LD. The electrode layer ETL may be regarded as an element included in the light emitting body LEL or as an element separate from the light emitting body LEL.

In case that the light emitting diode LD further includes the electrode layer ETL, the insulating film INF may expose an area (e.g., the upper surface) of the electrode layer ETL at the first end EP1. The insulating film INF may or may not surround the outer circumferential surface (e.g., the side circumference) of the electrode layer ETL.

Similarly, the light emitting diode LD may optionally further include another electrode layer (not illustrated) disposed around the first semiconductor layer SCL1. For example, the light emitting diode LD may further include at least one electrode layer disposed between the first semiconductor layer SCL1 and the current blocking layer CBL. In case that the light emitting diode LD further includes another electrode layer, the insulating film INF may expose the outer circumferential surface (e.g., the side circumference) of the other electrode layer.

The current blocking layer CBL may be formed so that no current flows therein or only a minute current less than a reference current flows therein. For example, the current blocking layer CBL may include an undoped intrinsic semiconductor or may include a first conductivity-type semiconductor doped with a dopant having a lower concentration than the dopant of the first and/or second semiconductor layers SCL1 and SCL2. As another example, the current blocking layer CBL may be an insulating layer including at least one insulating material.

In an embodiment, the current blocking layer CBL may include a nitride-based semiconductor material. For example, the current blocking layer CBL may include a semiconductor material selected from GaN, InAlGaN, AlGaN, InGaN, AlN, and InN.

In an embodiment, the current blocking layer CBL and the first semiconductor layer SCL1 may include a same semiconductor material. In an embodiment, the current blocking layer CBL and the first semiconductor layer SCL1 may include different semiconductor materials.

In an embodiment, in case that the first semiconductor layer SCL1 includes a first conductivity-type semiconductor doped with a first concentration (e.g., an N-type nitride-based semiconductor doped with a first concentration), the current blocking layer CBL may include a first conductivity-type semiconductor doped with a concentration lower than the first concentration (e.g., an N-type nitride-based semiconductor doped with a low concentration), or may include an undoped intrinsic semiconductor (e.g., a nitride-based intrinsic semiconductor). In case that the current blocking layer CBL is doped with a low concentration, the current blocking layer CBL and the first semiconductor layer SCL1 may be doped with a same conductivity type (e.g., an N-type), and may include a dopant identical to or different from that of the first semiconductor layer SCL1.

In an embodiment, the current blocking layer CBL may include at least one insulating material. Movement of carriers through the current blocking layer CBL may be substantially blocked. An insulating material that may be used to form the current blocking layer CBL is not particularly limited, and at least one insulating material among conventional insulating materials may be used as the material of the current blocking layer CBL.

The current blocking layer CBL may be substantially transparent or translucent. Therefore, light generated inside the light emitting diode LD may pass through the current blocking layer CBL and may be emitted to the outside of the light emitting diode LD. In an embodiment, in case that light generated by the light emitting diode LD is emitted to the outside of the light emitting diode LD without passing through the current blocking layer CBL, the current blocking layer CBL may be opaque.

The surface of the current blocking layer CBL exposed at the second end EP2 may be substantially flat. For example, the surface of the current blocking layer CBL may have a roughness of about 10 nm or less and may be substantially flat.

The first semiconductor layer SCL1 may be provided on the current blocking layer CBL. The first semiconductor layer SCL1 may be a first conductivity-type semiconductor layer including a first conductivity-type semiconductor (e.g., an N-type semiconductor).

In an embodiment, the first semiconductor layer SCL1 may include a nitride-based semiconductor material. For example, the first semiconductor layer SCL1 includes a semiconductor material selected from GaN, InAlGaN, AlGaN, InGaN, AlN, and InN and may be an N-type semiconductor layer doped with a first conductivity-type dopant such as Si, Ge, and Sn. However, the material constituting the first semiconductor layer SCL1 may be variously changed according to embodiments.

The active layer ACT may be provided on the first semiconductor layer SCL1 and may be formed in a single or multi-quantum well structure. The position of the active layer ACT may be variously changed according to the type of the light emitting diode LD. The active layer ACT may emit light having a wavelength of about 400 nm to about 900 nm and may use a double hetero-structure.

A clad layer (not illustrated) doped with a conductive dopant may be optionally provided above and/or below the active layer ACT. For example, the clad layer may include an AlGaN layer or an InAlGaN layer. According to an embodiment, a material such as AlGaN or AlInGaN may be used to form the active layer ACT, and various other materials may be used to form the active layer ACT.

The second semiconductor layer SCL2 may be provided on the active layer ACT. The second semiconductor layer SCL2 may be a semiconductor layer of a different type from the first semiconductor layer SCL1. For example, the second semiconductor layer SCL2 may be a second conductivity-type semiconductor layer including a second conductivity-type semiconductor (e.g., a P-type semiconductor).

In an embodiment, the second semiconductor layer SCL2 may include a nitride-based semiconductor material that is identical to or different from the current blocking layer CBL and/or the first semiconductor layer SCL1. For example, the second semiconductor layer SCL2 includes at least one semiconductor material selected from GaN, InAlGaN, AlGaN, InGaN, AlN, and InN and may be a P-type semiconductor layer doped with a second conductivity-type dopant such as Mg. However, the material constituting the second semiconductor layer SCL2 may be variously changed according to embodiments.

In an embodiment, the current blocking layer CBL, the first semiconductor layer SCL1, and the second semiconductor layer SCL2 may all include a nitride-based semiconductor material. For example, the current blocking layer CBL, the first semiconductor layer SCL1, and the second semiconductor layer SCL2 may be formed by using a same type of the nitride-based semiconductor material and by doping differently (e.g., doping or non-doping, different doping concentrations, and/or different types of dopant, etc.). Therefore, the current blocking layer CBL, the first semiconductor layer SCL1, and the second semiconductor layer SCL2 may have different electrical characteristics.

In an embodiment, the first semiconductor layer SCL1 and the second semiconductor layer SCL2 may have different lengths (or thicknesses) in the length direction DR_L of the light emitting diode LD. As an example, the first semiconductor layer SCL1 may be longer (or thicker) than the second semiconductor layer SCL2 in the length direction DR_L of the light emitting diode LD. Therefore, the active layer ACT may be disposed closer to the first end EP1 than to the second end EP2.

The electrode layer ETL may be optionally provided on the second semiconductor layer SCL2. The electrode layer ETL may protect the second semiconductor layer SCL2. The electrode layer ETL may be a contact electrode for smoothly and electrically connecting the second semiconductor layer SCL2 to an electrode or a line. For example, the electrode layer ETL may be an ohmic contact electrode or a Schottky contact electrode.

In describing the embodiments, the term "connection (or coupling)" may comprehensively mean a physical and/or electrical connection (or coupling). The term "connection (or coupling)" may comprehensively mean a direct or indirect connection (or coupling) and an integrated or non-integrated connection (or coupling).

The electrode layer ETL may be substantially transparent or translucent. Therefore, light generated inside the light emitting diode LD may pass through the electrode layer ETL and may be emitted to the outside of the light emitting diode LD. On the other hand, in case that light generated by the light emitting diode LD is emitted to the outside of the light emitting diode LD without passing through the electrode layer ETL, the electrode layer ETL may be opaque.

In an embodiment, the electrode layer ETL may include a metal or a metal oxide. For example, the electrode layer ETL may be formed using a metal such as chromium (Cr), titanium (Ti), aluminum (Al), gold (Au), nickel (Ni), or copper (Cu), an oxide or alloy thereof, and a transparent conductive material such as indium tin oxide (ITO), indium zinc oxide (IZO), indium tin zinc oxide (ITZO), zinc oxide (ZnO), or indium oxide ($In_2O_3$) solely or in combination.

The insulating film INF may include a transparent insulating material. Therefore, light generated in the active layer ACT may pass through the insulating film INF and may be emitted to the outside of the light emitting diode LD. For example, the insulating film INF may include at least one insulating material selected from $SiO_2$ or undefined silicon oxide ($SiO_x$), $Si_3N_4$ or undefined silicon nitride ($SiN_x$), $Al_2O_3$ or undefined aluminum oxide ($Al_xO_y$), and $TiO_2$ or undefined titanium oxide ($Ti_xO_y$), but the disclosure is not limited thereto.

The insulating film INF may include a single layer or multiple layers. For example, the insulating film INF may include a double film.

In an embodiment, the insulating film INF may be partially etched in at least a portion, for example, at least one of an upper portion and a lower portion. For example, the insulating film INF may be partially etched at the first end EP1 to have a rounded shape.

The insulating film INF may be partially or completely removed from the first and second ends EP1 and EP2 of the light emitting diode LD. Therefore, the current blocking layer CBL, the first semiconductor layer SCL1, the second semiconductor layer SCL2, the electrode layer ETL, and/or other electrode layers (e.g., other electrode layers provided between the current blocking layer CBL and the first semiconductor layer SCL1) may be partially exposed.

In case that the insulating film INF surrounds the surface of the light emitting diode LD, in particular, the outer circumferential surfaces of the first semiconductor layer SCL1, the active layer ACT, and the second semiconductor layer SCL2, short-circuit defects in the light emitting diode LD may be prevented. Therefore, electrical stability of the light emitting diode LD may be secured.

In case that the insulating film INF is provided on the surface of the light emitting diode LD, the lifespan and efficiency may be improved by minimizing the surface defect of the light emitting diode LD. Even in case that light emitting diodes LD closely contact each other, it is possible to prevent short-circuit defects from occurring between the light emitting diodes LD.

In an embodiment, the light emitting diode LD may be surface-treated. For example, each of the light emitting diodes LD may be surface-treated so that the light emitting diodes LD do not aggregate excessively in a fluid solution (or light emitting diode ink including at least one type of light emitting diode LD). As a non-limiting example related thereto, the insulating film INF itself may be formed as a hydrophobic film using a hydrophobic material, or a hydrophobic film including a hydrophobic material may be additionally formed on the insulating film INF.

In an embodiment, the light emitting diode LD may have a size to a degree of the nanoscale to the microscale. For example, the light emitting element LD may have a diameter (or a width of the cross-section) and/or a length to a degree of the nanoscale to the microscale. As an example, the light emitting diode LD may have a diameter in a range of several hundred nanometers and a length in a range of several micrometers. However, the size of the light emitting diode LD may be changed. For example, the light emitting diode LD may be formed in various sizes according to design conditions of various light emitting devices using the light emitting diode LD as a light source. The structure, shape, and/or type of the light emitting diode LD may be changed according to embodiments.

In case that a driving voltage is applied to the light emitting diode LD, electron-hole pairs are combined in the active layer ACT to cause the light emitting diode LD to emit light. Using this principle, light emission of the light emitting diode LD may be controlled.

The light emitting diode LD may be used in various types of devices requiring a light source. For example, light emitting diodes LD may be arranged in each pixel of the display device, and the light emitting diodes LD may be used as a light source of each pixel. However, the field of application of the light emitting diode LD is not limited to the above-described examples. For example, the light emitting diode LD may be used in other types of electronic devices that require a light source such as a lighting device.

FIGS. 3A to 3H are schematic cross-sectional views illustrating a method of manufacturing a light emitting diode LD according to an embodiment. As an example, FIGS. 3A to 3H sequentially illustrate a method of manufacturing the light emitting diode LD of FIGS. 1 and 2A according to an embodiment.

Referring first to FIGS. 1 to 3A, a substrate SB is prepared. A first sacrificial layer L1, a second sacrificial layer L2, an etching layer ECL, a current blocking layer CBL, a first semiconductor layer SCL1, an active layer ACT, and a second semiconductor layer SCL2 are sequentially formed on the substrate SB.

The substrate SB may be a manufacturing substrate for epitaxial growth. The substrate SB may be a commercially available single crystal substrate, but is not limited thereto. In an embodiment, the substrate SB may be a GaAs, GaP, or InP substrate. The substrate SB may include a ZnO substrate having a GaAs layer on its surface. A Ge substrate having a GaAs layer on its surface and a Si substrate having a GaAs layer on a Si wafer with a buffer layer therebetween may also be applied.

The substrate SB may be a substrate of various types and/or materials. For example, in case that selectivity for manufacturing the light emitting diode LD is satisfied and epitaxial growth can be smoothly performed, the material of the substrate SB is not particularly limited.

The first sacrificial layer L1 and the second sacrificial layer L2 may be sequentially formed on the substrate SB. The first sacrificial layer L1 and the second sacrificial layer L2 may be formed by epitaxial growth.

The first sacrificial layer L1 and the second sacrificial layer L2 may be positioned between the light emitting diode LD and the substrate SB in the process of manufacturing the light emitting diode LD and may physically separate the light emitting diode LD and the substrate SB from each other. The first sacrificial layer L1 and the second sacrificial layer L2 may be layers finally separated from the light emitting diode LD in the process of manufacturing the light emitting diode LD.

In an embodiment, the first sacrificial layer L1 may include a semiconductor material such as GaN, GaAs, AIAs, or AIGaAs. The first sacrificial layer L1 may include an intrinsic semiconductor that is not doped with impurities.

In an embodiment, the second sacrificial layer L2 and the first sacrificial layer L1 may include a same semiconductor material. For example, the second sacrificial layer L2 may include a semiconductor material such as GaN, GaAs, AIAs, or AIGaAs.

In an embodiment, the second sacrificial layer L2 and the etching layer ECL and/or the first semiconductor layer SCL1 may include a same semiconductor material (e.g., a nitride-based semiconductor material) and may be doped with a first conductivity type (e.g., an N-type) similar to the etching layer ECL and/or the first semiconductor layer SCL1. The second sacrificial layer L2 may be doped with a lower concentration than the etching layer ECL and may be doped to have conductivity sufficient to enable movement of carriers in the process of separating the substrate SB and the light emitting diode LD from each other.

The etching layer ECL is formed on the second sacrificial layer L2. The etching layer ECL may include a semiconductor material doped with a high concentration. For example, the etching layer ECL may include a first conductivity-type semiconductor (e.g., an N-type semiconductor) doped with a higher concentration than the second sacrificial layer L2 and/or the first semiconductor layer SCL1. The etching layer ECL is a layer that is etched and removed by an electrochemical method in the process of separating the substrate SB and the light emitting diode LD from each other, and may be doped with a concentration sufficient to facilitate etching by an electrochemical reaction.

In an embodiment, the etching layer ECL and the second sacrificial layer L2, the current blocking layer CBL, and/or the first semiconductor layer SCL1 may include a same semiconductor material (e.g., a nitride-based semiconductor material) and may have higher conductivity than the second sacrificial layer L2 and the current blocking layer CBL. For example, the etching layer ECL may be doped with a higher concentration than the second sacrificial layer L2 and the current blocking layer CBL so as to have higher conductivity.

The current blocking layer CBL is formed on the etching layer ECL. The current blocking layer CBL may include a semiconductor material undoped or doped with a low concentration. As another example, the current blocking layer CBL may include an insulating material. As an example, the current blocking layer CBL may have no conductivity or low conductivity so as to function as a barrier for preventing movement of carriers (e.g., electric charges or electrons) between the etching layer ECL and the first semiconductor layer SCL1 in the process of separating the substrate SB and the light emitting diode LD from each other.

As the current blocking layer CBL is formed, a portion in which electrochemical etching occurs in the process of separating the substrate SB and the light emitting diode LD from each other, may be limited. For example, by forming the current blocking layer CBL between the etching layer ECL and the first semiconductor layer SCL1, the electrochemical etching may be concentrated on the target layer, that is, the etching layer ECL. By blocking the inflow of carriers into the first semiconductor layer SCL1, no current may substantially flow in the upper layers including the first semiconductor layer SCL1. Therefore, damage to the first semiconductor layer SCL1 and the like in the process of separating the substrate SB and the light emitting diode LD from each other may be prevented, and the separation surface of the light emitting diode LD (e.g., the second end EP2 in FIGS. 2A and 2B) may be substantially planarized.

The first semiconductor layer SCL1 is formed on the current blocking layer CBL. The first semiconductor layer SCL1 may be formed by epitaxial growth and may be formed by a metal organic chemical vapor deposition (MOCVD) method, a molecular beam epitaxy (MBE) method, a vapor phase epitaxy (VPE) method, a liquid phase epitaxy (LPE) method, or the like, but the disclosure is not limited thereto.

In an embodiment, the first semiconductor layer SCL1 may include a semiconductor material including a Group Ill (Ga, Al, In) to V (P, As) material. For example, the first semiconductor layer SCL1 may include a semiconductor material such as GaN, InAlGaN, AlGaN, InGaN, AlN, or InN and may include a first conductivity-type semiconductor doped with a first conductivity-type dopant (e.g., an N-type dopant) such as Si, Ge, and Sn.

The active layer ACT is formed on the first semiconductor layer SCL1. The active layer ACT is a portion in which electrons and holes are recombined with each other. The active layer ACT transitions to a low energy level as the electrons and holes are recombined with each other, and may emit light having a wavelength corresponding thereto. The active layer ACT may be formed in a single or multiple quantum well structure and may include at least one material selected from GaInP, AlGaInP, GaAs, AlGaAs, InGaAs, InGaAsP, InP, and InAs, but the disclosure is not limited thereto.

The second semiconductor layer SCL2 is formed on the active layer ACT. In an embodiment, the second semiconductor layer SCL2 may include a semiconductor material including a Group Ill (Ga, Al, In) to V (P, As) material. For example, the second semiconductor layer SCL2 may include a semiconductor material such as GaN, InAlGaN, AlGaN, InGaN, AlN, or InN and may include a second conductivity-type semiconductor doped with a second conductivity-type dopant (e.g., a P-type dopant) such as Mg.

Referring to FIGS. 1 to 3B, the first semiconductor layer SCL1, the active layer ACT, and the second semiconductor layer SCL2 are etched in a vertical direction. For example, after a mask (not illustrated) is placed on the substrate SB, a laminate including the first semiconductor layer SCL1, the active layer ACT, and the second semiconductor layer SCL2 may be etched in a rod shape. According to an embodiment, the first semiconductor layer SCL1 is etched in the vertical direction by the remaining thickness except for a partial thickness of a lower portion thereof, and the active layer ACT and the second semiconductor layer SCL2 are etched in the vertical direction by the entire thickness, so that the first semiconductor layer SCL1, the active layer ACT, and the second semiconductor layer SCL2 are etched in a rod shape.

In an embodiment, the first semiconductor layer SCL1, the active layer ACT, and the second semiconductor layer SCL2 may be etched at a nanoscale or microscale interval and/or size. Therefore, light emitting diodes LD each having a nanoscale or microscale size may be manufactured on a single substrate SB.

Referring to FIGS. 1 to 3C, an insulating film INF is formed on the etched surfaces of the first semiconductor layer SCL1, the active layer ACT, and the second semiconductor layer SCL2. The insulating film INF may be formed using at least one insulating material selected from silicon oxide ($SiO_x$), silicon nitride ($SiN_x$), silicon oxynitride ($SiO_xN_y$), aluminum oxide ($Al_xO_y$), and titanium oxide ($Ti_xO_y$), but the disclosure is not limited thereto.

Referring to FIGS. 1 to 3D, the insulating film INF is etched so that the upper surface of the second semiconductor layer SCL2 is exposed. The insulating film INF may be etched even on the upper surface of the second semiconductor layer SCL2 that is not etched.

Referring to FIGS. 1 to 3E, the second semiconductor layer SCL2 is etched in the vertical direction by the remaining thickness, and the current blocking layer CBL and the etching layer ECL are etched in the vertical direction. In an embodiment, the second semiconductor layer SCL2, the current blocking layer CBL, and the etching layer ECL may be etched so that the second sacrificial layer L2 is exposed. Therefore, the side surface of the etching layer ECL may be exposed under each of the light emitting bodies LEL. The second sacrificial layer L2 may not be etched or may be etched by a partial thickness, so that the upper surface of the second sacrificial layer L2 may be exposed.

Referring to FIGS. 1 to 3F, an electrode E1 is formed on the second sacrificial layer L2. For example, the electrode E1 may be formed by forming a metal pattern on the second sacrificial layer L2. The electrode E1 may be used to apply an electric field for separating the substrate SB and the light emitting diode LD from each other by an electrochemical method in a subsequent process.

Referring to FIGS. 1 to 3G, the substrate SB on which the light emitting bodies LEL are formed is immersed in an electrolyte together with another electrode E2 so that at least the etching layer ECL is immersed therein, and an electric field is formed by applying a voltage to the electrodes E1 and E2. For example, the electrode E1 formed on the second sacrificial layer L2 may be used as an oxidizing electrode (an anode) by applying a positive voltage to the electrode E1, and the electrode E2 may be used as a reducing electrode (a cathode) by applying a negative voltage to the electrode E2.

As the electrolyte, oxalic acid or the like may be used, but the disclosure is not limited thereto. For example, another type of electrolyte may be used which causes an oxidation-reduction reaction to occur at the interface of the etching layer ECL so that the etching layer ECL may be decomposed.

In an embodiment, in case that the etching layer ECL is a semiconductor layer including GaN, an oxidation-reduction reaction as shown in Chemical Formula 1 below may occur at the interface between the etching layer ECL and the electrolyte. Therefore, the etching layer ECL may be etched using an electrochemical method.

[Chemical Formula 1]

$$2GaN + 2h^+ \rightarrow 2Ga + N_2$$

Referring to FIGS. 1 to 3H, the light emitting diodes LD may be separated from the substrate SB as the etching layer ECL is etched.

According to the above-described embodiment, each of the light emitting diodes LD may be separated from the substrate SB by an electrochemical method. By forming the current blocking layer CBL between the etching layer ECL and the first semiconductor layer SCL1, a portion etched in the process of separating the substrate SB and the light emitting diode LD from each other may be limited by the etching layer ECL.

Therefore, damage to the first semiconductor layer SCL1 in the process of separating the substrate SB and the light emitting diode LD from each other, may be prevented, and the separation surface of the light emitting diode LD may be planarized. By separating the light emitting diodes LD manufactured on the substrate SB into a uniform length, the size (e.g., the length) of the light emitting diodes LD may be uniform.

FIGS. 4A to 4H are schematic cross-sectional views illustrating a method of manufacturing a light emitting diode LD according to an embodiment. As an example, FIGS. 4A to 4D sequentially illustrate a method of manufacturing the light emitting diode LD of FIGS. 1 and 2B according to an embodiment, focusing on the configuration different from those of the embodiments of FIGS. 3A to 3H. In describing the embodiments of FIGS. 4A to 4D, detailed descriptions of the configuration similar or identical to the embodiments of FIGS. 3A to 3H will be omitted.

Referring to FIGS. 1 to 4A, a first sacrificial layer L1, a second sacrificial layer L2, an etching layer ECL, a current blocking layer CBL, a first semiconductor layer SCL1, an active layer ACT, a second semiconductor layer SCL2, and an electrode layer ETL are sequentially formed on a substrate SB. For example, in this embodiment, the electrode layer ETL is further formed on the second semiconductor layer SCL2.

The electrode layer ETL may include a metal or a metal oxide. In an embodiment, the electrode layer ETL may include a transparent metal oxide such as ITO in order to minimize loss of light emitted to the outside of the light emitting diode LD and improve the current spreading effect to the second semiconductor layer SCL2 in the light emitting diode LD.

Referring to FIGS. 1 to 4B, the first semiconductor layer SCL1, the active layer ACT, the second semiconductor layer SCL2, and the electrode layer ETL are etched in a vertical direction. For example, a laminate including the first semiconductor layer SCL1, the active layer ACT, the second semiconductor layer SCL2, and the electrode layer ETL may be etched in a rod shape.

Referring to FIGS. 1 to 4C, an insulating film INF is formed on the etched surfaces of the first semiconductor layer SCL1, the active layer ACT, the second semiconductor layer SCL2, and the electrode layer ETL.

Referring to FIGS. 1 to 4D, the insulating film INF is etched so that the upper surface of the electrode layer ETL is exposed.

Substantially identical or similar process(es) as illustrated in FIGS. 3E to 3H may be performed to manufacture the light emitting diode LD including the electrode layer ETL as in the embodiment of FIG. 2B.

FIGS. 5A to 6B are schematic cross-sectional views illustrating a method of manufacturing a light emitting diode LD according to an embodiment. As an example, FIGS. 5A to 6B illustrate different modified embodiments in relation to the etching layer ECL and illustrate a method of manufacturing a light emitting diode LD according to the respective embodiments, focusing on the etching layer ECL. In describing the embodiment(s) of FIGS. 5A to 6B, detailed descriptions of the configuration similar to or identical to the embodiments (e.g., the embodiments of FIGS. 3A to 3H) described above will be omitted.

Figure 5A:
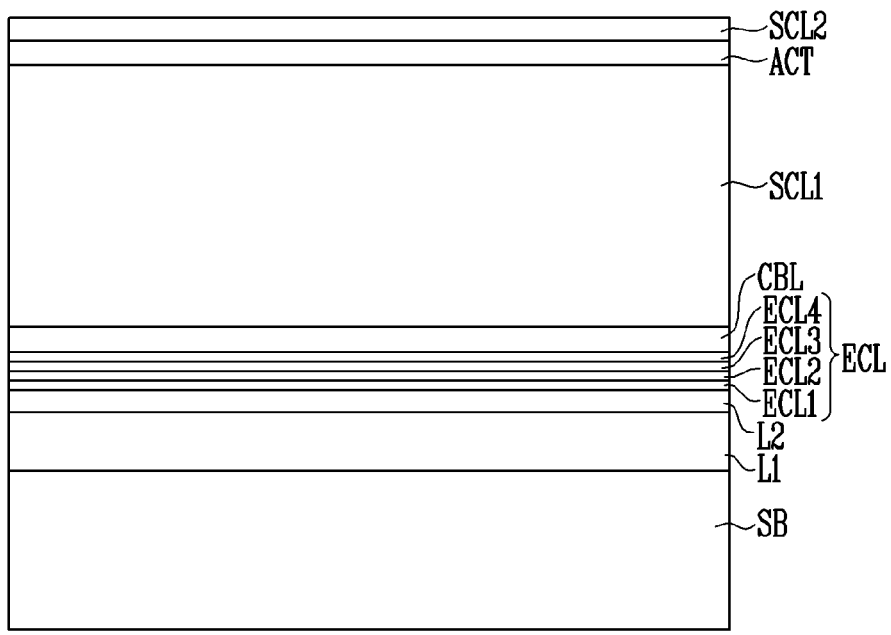
FIGS. 5A and 5B are cross-sectional views schematically illustrating a method of manufacturing a light emitting diode according to an embodiment of the disclosure.
Figure 5B:
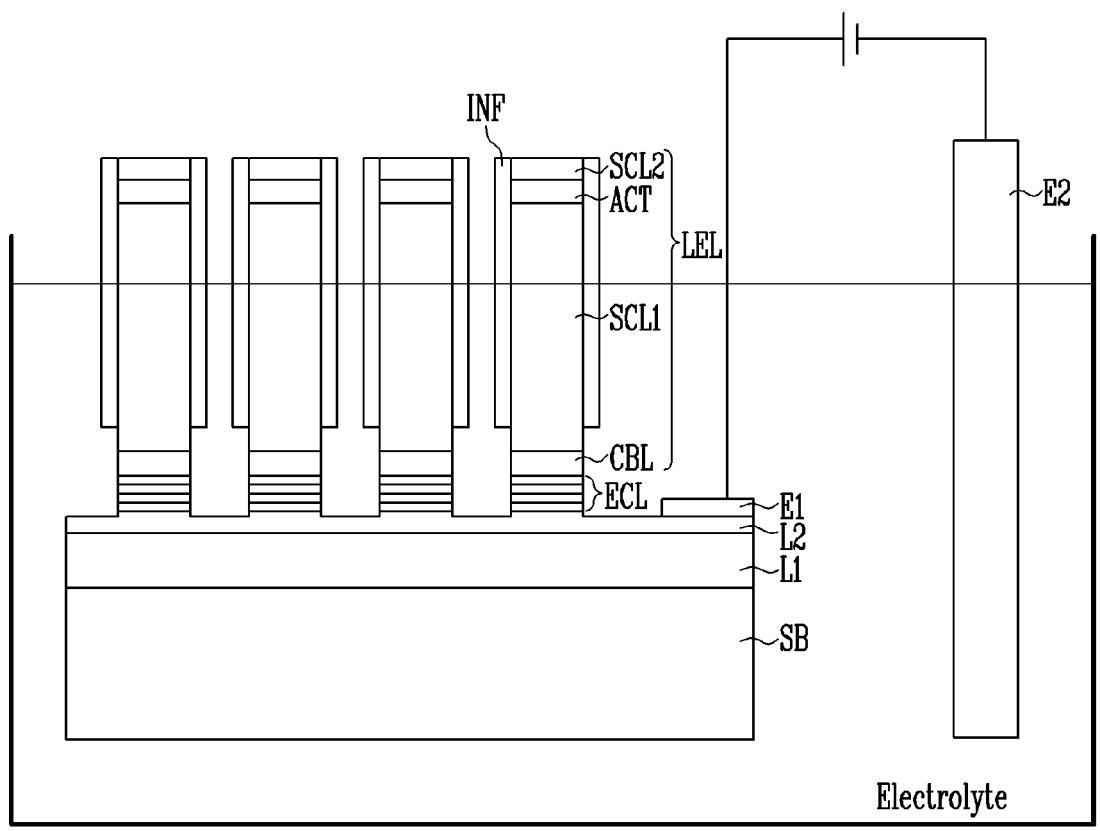

Referring to FIGS. 5A and 5B, the etching layer ECL may be formed as a multi-layer. For example, as illustrated in FIG. 5A, after a multi-layered etching layer ECL is formed on a second sacrificial layer L2, a current blocking layer CBL, a first semiconductor layer SCL1, an active layer ACT, and a second semiconductor layer SCL2 may be sequentially formed on the multi-layered etching layer ECL.

The etching layer ECL may be formed as at least a double layer including a first etching layer ECL1 and a second etching layer ECL2 sequentially formed on the second sacrificial layer L2. The first etching layer ECL1 and the second etching layer ECL2 may be doped with different concentrations. For example, the first etching layer ECL1 and the second etching layer ECL2 may include a same semiconductor material and/or dopant, and the first etching layer ECL1 is doped with a higher concentration than the second etching layer ECL2.

The etching layer ECL may be formed as multiple layers including three or more layers. For example, the etching layer ECL may further include at least one of a third etching layer ECL3 and a fourth etching layer ECL4.

The third etching layer ECL3 is provided on the second etching layer ECL2 and may be doped with a different concentration from the second etching layer ECL2. For example, the second etching layer ECL2 and the third etching layer ECL3 may include a same semiconductor material and/or dopant, and the third etching layer ECL3 is doped with a higher concentration than the second etching layer ECL2.

The fourth etching layer ECL4 is provided on the third etching layer ECL3 and may be doped with a different concentration from the third etching layer ECL3. For example, the third etching layer ECL3 and the fourth etching layer ECL4 may include a same semiconductor material and/or dopant, and the fourth etching layer ECL4 is doped with a lower concentration than the third etching layer ECL3.

As described above, in case that the etching layer ECL is a multi-layer including layers having different doping concentrations, reactivity with an electrolyte may be increased in a process of separating the substrate SB and the light emitting diode LD from each other, as illustrated in FIG. 5B. Therefore, the light emitting diode LD can be more easily separated from the substrate SB.

Figure 6A:
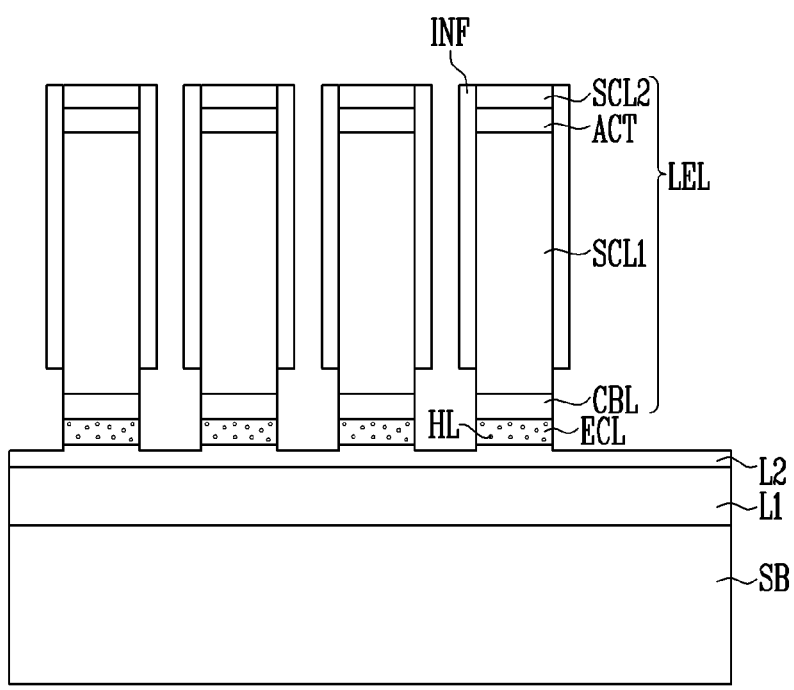
FIGS. 6A and 6B are cross-sectional views schematically illustrating a method of manufacturing a light emitting diode according to an embodiment of the disclosure.
Figure 6B:
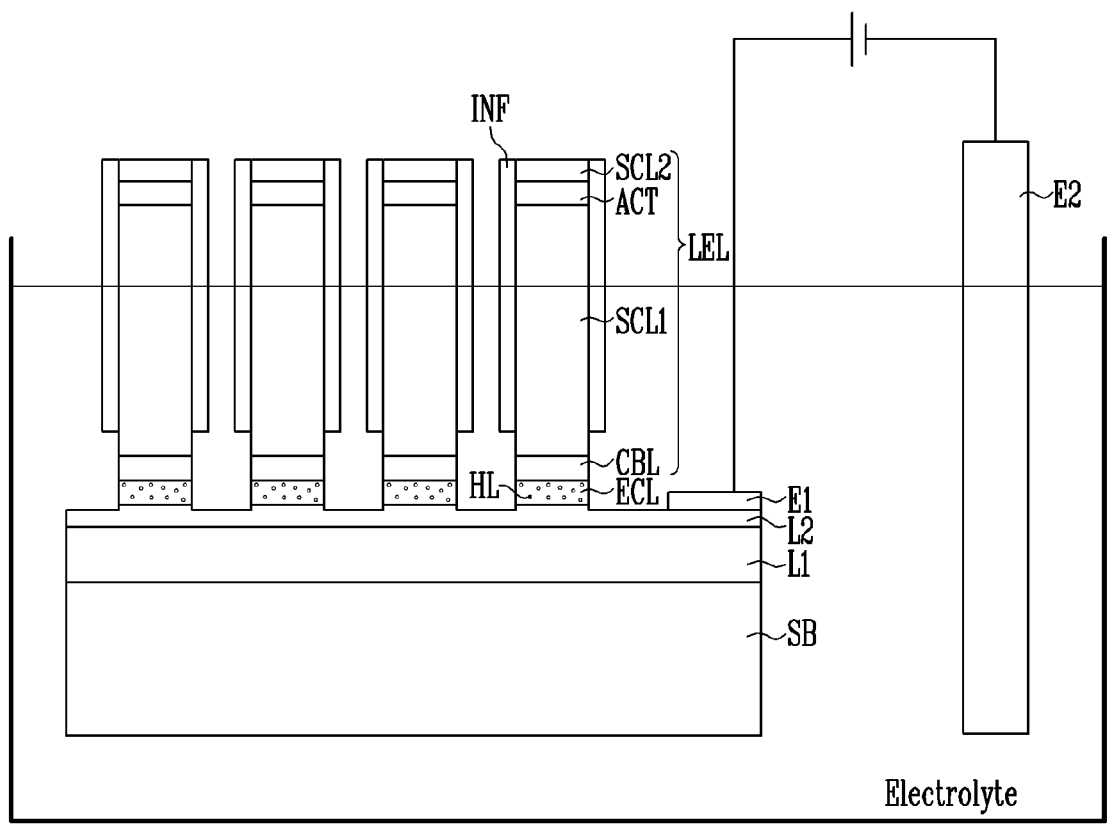

Referring to FIGS. 6A and 6B, the etching layer ECL may include fine holes HL formed on the surface thereof. For example, as illustrated in FIG. 6A, after the etching layer ECL and the like are etched in the vertical direction, the fine holes HL may be formed on the surface of the etching layer ECL. The fine holes HL may increase the surface area of the etching layer ECL contacting the electrolyte, and the size, shape, and/or number of fine holes HL are not particularly limited.

As such, in case that the etching layer ECL includes the fine holes HL, reactivity with an electrolyte may be increased in a process of separating the substrate SB and the light emitting diode LD from each other, as illustrated in FIG. 6B. Therefore, the light emitting diode LD can be more easily separated from the substrate SB.

Figure 7:
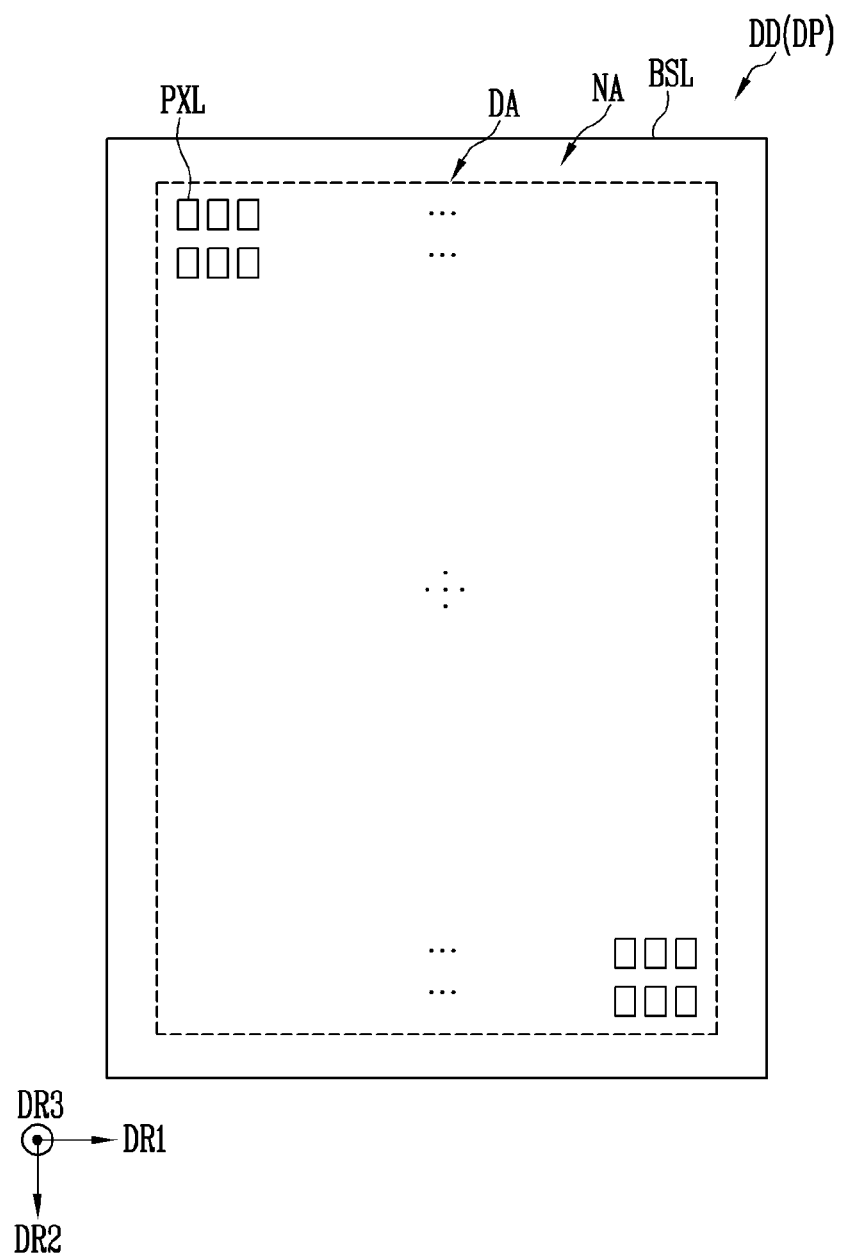
FIG. 7 is a plan view schematically illustrating a display device according to an embodiment of the disclosure.

FIG. 7 is a schematic plan view illustrating a display device DD according to an embodiment. As an example, FIG. 7 illustrates the display device DD as an example of a device capable of using the light emitting diode LD described in the embodiments of FIGS. 1, 2A, and 2B as a light source. In particular, the structure of the display device DD will be described focusing on a display panel DP.

FIG. 7 briefly illustrates the structure of the display panel DP, focusing on a display area DA. However, according to embodiments, at least one driving circuit part, lines, and/or pads may be further provided on the display panel DP.

Referring to FIG. 7, the display panel DP includes a base layer BSL and pixels PXL provided on the base layer BSL.

The base layer BSL and the display panel DP including the same may include the display area DA for displaying an image and a non-display area NA excluding the display area DA. The Pixels PXL may be provided in the display area DA, and lines, pads, and/or an embedded circuit part electrically connected to the pixels PXL may be provided in the non-display area NA.

The display panel DP may be provided in various shapes. As an example, the display panel DP may be provided in a rectangular plate shape, but the disclosure is not limited thereto. For example, the display panel DP may have a shape such as a circular shape or an elliptical shape. The display panel DP may include an angled edge and/or a curved edge.

For convenience, FIG. 7 illustrates that the display panel DP has a rectangular plate shape. An extending direction of a short side of the display panel DP is indicated by a first direction DR1, an extending direction of a long side thereof is indicated by a second direction DR2, and a direction perpendicular to the extending directions of the long side and the short side (e.g., a thickness or height direction of the display panel DP) is indicated by a third direction DR3.

The display area DA may have various shapes. For example, the display area DA may have various shapes including a rectangular shape, a circular shape, or an elliptical shape.

The pixels PXL may be disposed in the display area DA of the base layer BSL. As an example, the display area DA may include pixel areas in which each pixel PXL is disposed.

The pixel PXL may include at least one light source driven by a control signal (e.g., a scan signal and a data signal) and/or power (e.g., first power and second power). In an embodiment, the light source may include at least one light emitting diode LD (e.g., a rod-shaped light emitting diode LD having a size to a degree of the nanoscale to the microscale) according to the embodiment(s) of FIGS. 1, 2A, and/or 2B.

The pixel PXL may have a structure according to at least one of the embodiments to be described below. For example, each pixel PXL may have a structure to which one of the embodiments to be described below is applied, or a structure to which at least two embodiments are applied in combination.

The pixel PXL may be an active pixel, but the disclosure is not limited thereto. For example, the pixel PXL may be a passive pixel.

Figure 8:
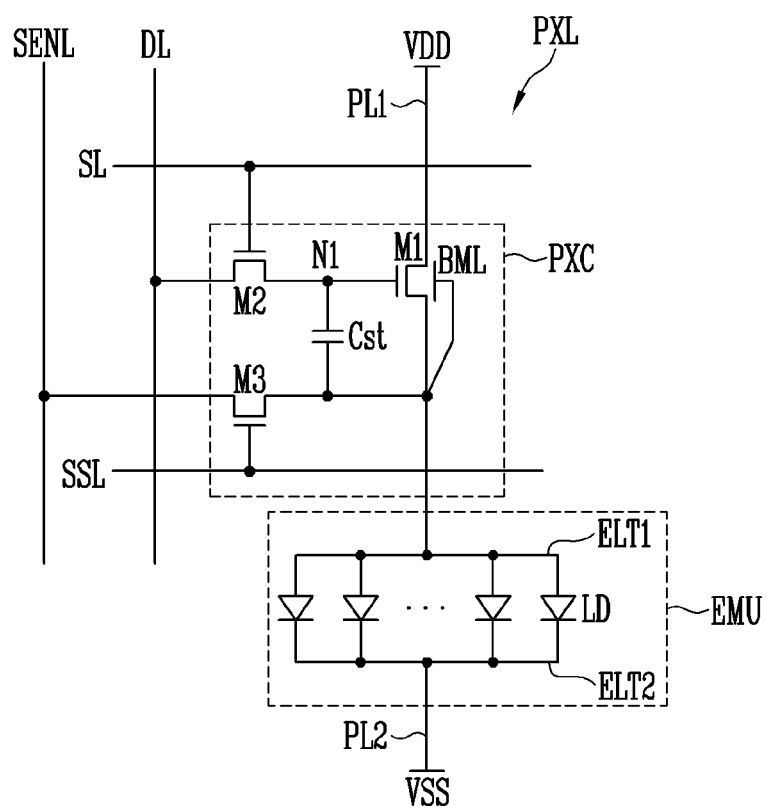
FIG. 8 is a circuit diagram schematically illustrating a pixel according to an embodiment of the disclosure.

FIG. 8 is a schematic circuit diagram illustrating a pixel PXL according to an embodiment. Each pixel PXL illustrated in FIG. 8 may be one of the pixels PXL disposed in the display area DA of FIG. 7. The pixels PXL disposed in the display area DA may be substantially identical or similar to each other.

Referring to FIG. 8, the pixel PXL includes an emission unit (or emission part) EMU for generating light having a luminance corresponding to a data signal. The pixel PXL may further include a pixel circuit PXC for driving the emission part EMU.

The emission part EMU includes at least one light emitting diode LD electrically connected between first power VDD and second power VSS. As an example, the emission part EMU may include light emitting diodes LD.

For example, the emission part EMU may include a first electrode ELT1 electrically connected to the first power VDD through the pixel circuit PXC and a first power line PL1, a second electrode ELT2 electrically connected to the second power VSS through a second power line PL2, and light emitting diodes LD electrically connected in parallel between the first and second electrodes ELT1 and ELT2 The first electrode ELT1 may be an anode electrode of the emission part EMU, and the second electrode ELT2 may be a cathode electrode of the emission part EMU.

Each of the light emitting diodes LD may be electrically connected between the first power VDD and the second power VSS in a forward direction to constitute effective light sources. These effective light sources may constitute the emission part EMU of the pixel PXL.

The first power VDD and the second power VSS may have different potentials. For example, the first power VDD may be a high potential power, and the second power VSS may be a low potential power. A potential difference between the first power VDD and the second power VSS may be set to be greater than or equal to a threshold voltage of the light emitting diodes LD during the emission period of the pixel PXL.

The light emitting diodes LD may emit light having a luminance corresponding to a driving current supplied through the pixel circuit PXC. During each frame period, the pixel circuit PXC may supply the emission part EMU with a driving current corresponding to a gray scale value to be expressed in the corresponding frame. The driving current supplied to the emission part EMU may be divided and supplied to the light emitting diodes LD electrically connected in the forward direction. Therefore, while each of the light emitting diodes LD emits light having a luminance corresponding to the current flowing therethrough, the emission part EMU may emit light having a luminance corresponding to the driving current.

In an embodiment, the emission part EMU may further include at least one ineffective light source. For example, the emission part EMU may further include an ineffective light emitting diode that is aligned between the first and second electrodes ELT1 and ELT2 in a reverse direction, or is not completely (or validly) connected between the first and second electrodes ELT1 and ELT2. The ineffective light emitting diode may maintain a non-emission state even in case that a driving voltage is applied to the first and second electrodes ELT and ELT2.

Although FIG. 8 illustrates an embodiment in which the pixel PXL includes the emission part EMU having a parallel structure, the disclosure is not limited thereto. For example, the pixel PXL may include an emission part EMU having a series structure or a series/parallel structure. The emission part EMU may include light emitting diodes LD electrically connected in a series structure or a series/parallel structure between the first electrode ELT1 and the second electrode ELT2.

The pixel circuit PXC may be electrically connected between the first power VDD and the emission part EMU. The pixel circuit PXC may be electrically connected to a scan line SL and a data line DL of the pixel PXL to control the operation of the emission part EMU in response to a scan signal and a data signal respectively supplied from the scan line SL and the data line DL. The pixel circuit PXC may be optionally further and electrically connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a capacitor Cst.

The first transistor M1 is electrically connected to the first power VDD and the first electrode ELT1 of the emission part EMU. A gate electrode of the first transistor M1 is electrically connected to a first node N1. The first transistor M1 controls a driving current supplied to the emission part EMU in response to the voltage of the first node N1. For example, the first transistor M1 may be a driving transistor of the pixel PXL.

In an embodiment, the first transistor M1 may optionally include a bottom metal layer BML (also referred to as a "back gate electrode"). The gate electrode of the first transistor M1 and the bottom metal layer BML may overlap each other with an insulating layer therebetween. In an embodiment, the bottom metal layer BML may be electrically connected to an electrode of the first transistor M1, for example, a source electrode (or a drain electrode).

In an embodiment in which the first transistor M1 includes the bottom metal layer BML, a back-biasing technology (or a sync technology) may be applied which shifts the threshold voltage of the first transistor M1 in a negative or positive direction by applying a back-biasing voltage to the bottom metal layer BML of the first transistor M1 in case that the pixel PXL is driven. For example, a source-sink technology may be applied by electrically connecting the bottom metal layer BML to the source electrode of the first transistor M1. In case that light incident onto a semiconductor pattern is blocked by arranging the bottom metal layer BML under a semiconductor pattern constituting the channel of the first transistor M1, the operating characteristics of the first transistor M1 may be stabilized.

The second transistor M2 is electrically connected to the data line DL and the first node N1. A gate electrode of the second transistor M2 is electrically connected to the scan line SL. The second transistor M2 is turned on in case that a scan signal having a gate-on voltage (e.g., a high level voltage) is supplied from the scan line SL and electrically connects the data line DL to the first node N1.

A data signal of a corresponding frame is supplied to the data line DL during each frame period, and the data signal is transmitted to the first node N1 by the second transistor M2 turned on during a period in which the scan signal having the gate-on voltage is supplied. For example, the second transistor M2 may be a switching transistor for transmitting each data signal to the pixel PXL.

An electrode of the capacitor Cst is electrically connected to the first node N1, and another electrode of the capacitor Cst is electrically connected to the second electrode of the first transistor M1. The capacitor Cst charges a voltage corresponding to the data signal supplied to the first node N1 during each frame period.

The third transistor M3 is electrically connected to the second electrode of the first transistor M1 (and/or the first electrode ELT1 of the emission unit EMU) and the sensing line SENL. A gate electrode of the third transistor M3 is electrically connected to the sensing signal line SSL. The third transistor M3 may transmit, to the sensing line SENL, a voltage value applied to the second electrode of the first transistor M1 according to a sensing signal supplied to the sensing signal line SSL. The voltage value transmitted through the sensing line SENL may be provided to an external circuit (e.g., a timing controller) and used to compensate for a deviation in characteristics of the pixels PXL.

Although FIG. 8 illustrates that the transistors included in the pixel circuit PXC are all N-type transistors, the disclosure is not limited thereto. For example, at least one of the first, second, and third transistors M1, M2, and M3 may be changed to a P-type transistor.

The structure and driving method of the pixel PXL may be variously changed according to embodiments. For example, the pixel circuit PXC may not include the third transistor M3. The pixel circuit PXC may further include other circuit elements such as a compensation transistor for compensating the threshold voltage of the first transistor M1, etc., an initialization transistor for initializing the voltage of the first node N1 and/or the first electrode ELT1 of the emission part EMU, an emission control transistor for controlling a period in which the driving current is supplied to the emission part EMU, and/or a boosting capacitor for boosting the voltage of the first node N1.

In an embodiment, in case that the pixel PXL is a pixel of a passive light emitting display device, the pixel circuit PXC may be omitted. The emission part EMU may be directly connected to the scan line SL, the data line DL, the first power line PL1, and the second power line PL2, and/or other signal lines or power lines.

Figure 9:
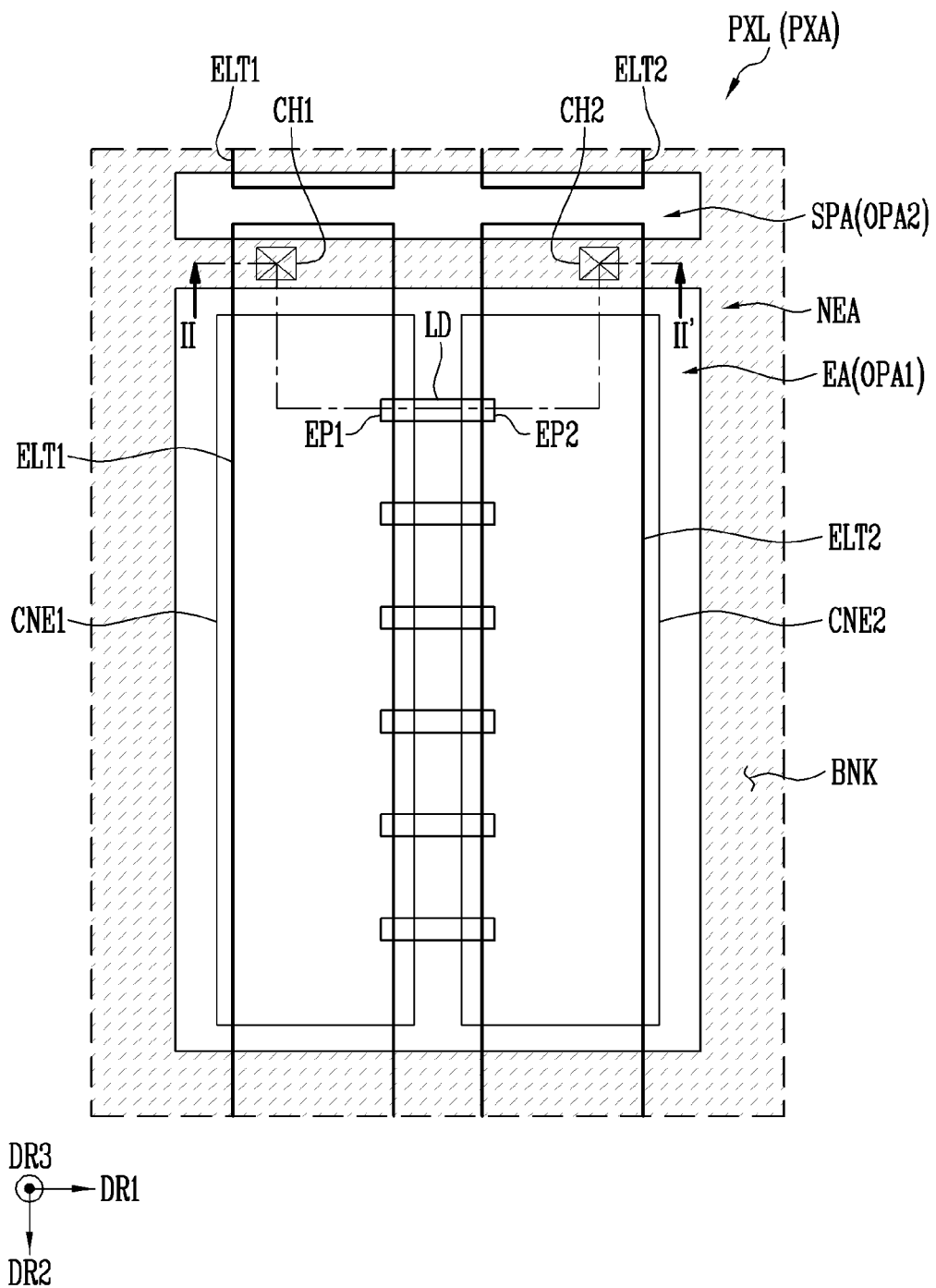
FIG. 9 is a plan view schematically illustrating a pixel according to an embodiment of the disclosure.

FIG. 9 is a schematic plan view illustrating a pixel PXL according to an embodiment. FIG. 9 illustrates the structure of the pixel PXL, focusing on the emission part EMU. For example, as in the embodiment of FIG. 8, FIG. 9 illustrates the structure of the emission part EMU including a first electrode ELT1, a second electrode ELT2, and light emitting diodes LD electrically connected in parallel between the first electrode ELT1 and the second electrode ELT2.

FIG. 9 illustrates an embodiment in which each of the emission parts EMU is electrically connected to a power line (e.g., first and/or second power lines PL1 and PL2), a circuit element (e.g., at least one circuit element constituting a pixel circuit PXC), and/or a signal line (e.g., a scan line SL and/or a data line DL) through first and second contact holes CH1 and CH2. However, the disclosure is not limited thereto. For example, in an embodiment, at least one of the first and second electrodes ELT1 and ELT2 of each pixel PXL may be directly and electrically connected to a power line and/or a signal line without passing through a contact hole and/or an intermediate line.

Referring to FIG. 9, the pixel PXL is provided in each pixel area PXA. The pixel area PXA may comprehensively refer to a pixel circuit area in which circuit elements for constituting the pixel PXL are disposed, and an emission area EA in which the emission part EMU of the pixel PXL is disposed.

The pixel area PXA includes the emission area EA and a non-emission area NEA surrounding the emission area EA. The pixel area PXA may further include a separation area SPA disposed between the non-emission areas NEA and spaced apart from the emission area EA. A bank BNK may be provided in the non-emission area NEA, and the bank BNK may not be provided in the emission area EA and/or the separation area SPA.

The emission area EA may be an area in which at least one light emitting diode LD constituting the emission part EMU of each pixel PXL is supplied and aligned. Hereinafter, it is assumed that multiple light emitting diodes LD are provided in each emission area EA, and the configuration of each embodiment will be described below.

Electrodes (e.g., the first and second electrodes ELT1 and ELT2) electrically connected to the light emitting diodes LD, and/or first and second contact electrodes CNE1 and CNE2 or one area of the electrodes may be disposed in the emission area EA.

The pixel PXL may include the first electrode ELT1 and the second electrode ELT2 spaced apart from each other in the emission area EA, and the light emitting diodes LD disposed and/or aligned between the first and second electrodes ELT1 and ELT2. Here, that the light emitting diodes LD are disposed and/or aligned between the first and second electrodes ELT1 and ELT2 may mean that, in a plan view, at least a portion of each of the light emitting diodes LD is located between the first and second electrodes ELT1 and ELT2.

The pixel PXL may further include the first contact electrode CNE1 and the second contact electrode CNE2 electrically connected to the light emitting diodes LD. The pixel PXL may further include at least one other electrode, a conductive pattern, and/or an insulating pattern. For example, the pixel PXL may further include at least one bank pattern disposed under the first and second electrodes ELT1 and ELT2 so as to overlap a portion of each of the first and second electrodes ELT1 and ELT2 (e.g., the first and second bank patterns BNP1 and BNP2 of FIGS. 10A and 10B).

The first electrode ELT1 and the second electrode ELT2 may be spaced from each other in the first direction DR1 and may extend in the second direction DR2. The first direction DR1 and the second direction DR2 may be directions that intersect each other (e.g., orthogonal to each other). In an embodiment, the first direction DR1 may be a horizontal direction (or a row direction) of the display area DA, and the second direction DR2 may be a vertical direction (or a column direction) of the display area DA, but the disclosure is not limited thereto.

FIG. 9 illustrates an embodiment in which a first electrode ELT1 and a second electrode ELT2 are disposed in each emission area EA, but the disclosure is not limited thereto. For example, the number of first and/or second electrodes ELT1 and ELT2 disposed in each pixel PXL may be changed.

In case that first electrodes ELT1 are disposed in a pixel PXL, the first electrodes ELT1 may be integrally or non-integrally connected to each other (or may be integral or not integral with each other). Similarly, in case that second electrodes ELT2 are disposed in a pixel PXL, the second electrodes ELT2 may be integrally or non-integrally connected to each other.

The first electrode ELT1 and/or the second electrode ELT2 may have a pattern separated for each pixel PXL, or may have a pattern commonly connected to the pixels PXL. For example, each of the first electrodes ELT1 may have an independent pattern cut off from the separation area SPA located outside the corresponding emission area EA. Each second electrode ELT2 may pass through the separation area SPA and extend to an outer portion of the corresponding pixel area PXA so as to have an independent pattern cut off in the separation area SPA located outside the corresponding emission area EA, or to integrally connect to the second electrode ELT2 of the adjacent pixel PXL.

Before the process of forming the pixel PXL, in particular, before the alignment of the light emitting diodes LD is completed, the first electrodes ELT1 of the pixels PXL disposed in the display area DA may be electrically connected to each other, and the second electrodes ELT2 of the pixels PXL may be electrically connected to each other. For example, before the alignment of the light emitting diodes LD is completed, the first electrodes ELT1 of the pixels PXL may be integrally or non-integrally connected to each other to form a first alignment line, and the second electrodes ELT2 of the pixels PXL may be integrally or non-integrally connected to each other to form a second alignment line.

The first alignment line and the second alignment line may receive a first alignment signal and a second alignment signal, respectively, in the step of aligning the light emitting diodes LD. The first and second alignment signals may have different waveforms, potentials, and/or phases. Accordingly, an electric field is formed between the first and second alignment lines, so that the light emitting diodes LD supplied to the emission area EA can be aligned between the first and second alignment lines. After the alignment of the light emitting diodes LD is completed, the pixels PXL may be individually driven by cutting at least the first alignment line in the separation area SPA and the like and separating the first alignment line into the respective first electrodes ELT1.

The first electrode ELT1 may be electrically connected to a circuit element (e.g., at least one transistor constituting the pixel circuit PXC), a power line (e.g., a first power line PL1), and/or a signal line (e.g., a scan line SL, a data line DL, or a control line) through a first contact hole CH1. In an embodiment, the first electrode ELT1 may be directly connected to a power line or a signal line.

In an embodiment, the first electrode ELT1 may be electrically connected to a circuit element disposed under the first contact hole CH1 and electrically connected to the first line through the circuit element. The first line may be a first power line PL1 for supplying the first power VDD, but the disclosure is not limited thereto.

The second electrode ELT2 may be electrically connected to a circuit element (e.g., at least one transistor constituting the pixel circuit PXC), a power line (e.g., a second power line PL2), and/or a signal line (e.g., a scan line SL, a data line DL, or a control line) through a second contact hole CH2. In an embodiment, the second electrode ELT2 may be directly and electrically connected to a power line or a signal line.

In an embodiment, the second electrode ELT2 may be electrically connected to the second line disposed thereunder through the second contact hole CH2. The second line may be a second power line PL2 for supplying the second power VSS, but the disclosure is not limited thereto.

Each of the first and second contact holes CH1 and CH2 may or may not overlap the bank BNK. For example, the first and second contact holes CH1 and CH2 may be disposed in the non-emission area NEA between the emission area EA and the separation area SPA and may overlap the bank BNK. In an embodiment, at least one of the first and second contact holes CH1 and CH2 may be disposed in the emission area EA or the separation area SPA.

Each of the first and second electrodes ELT1 and ELT2 may include a single layer or multiple layers. For example, the first electrode ELT1 may include at least one reflective electrode layer including a reflective conductive material and may optionally further include at least one transparent electrode layer and/or a conductive capping layer. Similarly, the second electrode ELT2 may include at least one reflective electrode layer including a reflective conductive material and may optionally further include at least one transparent electrode layer and/or a conductive capping layer. The reflective conductive material may be a metal having a high reflectance in a visible light wavelength band, for example, at least one metal material selected from aluminum (Al), gold (Au), and silver (Ag), but the disclosure is not limited thereto.

The light emitting diodes LD may be aligned between the first electrode ELT1 and the second electrode ELT2. For example, the light emitting diodes LD may be aligned and/or electrically connected in parallel between the first electrode ELT1 and the second electrode ELT2. For example, each of the light emitting diodes LD may be aligned between the first electrode ELT1 and the second electrode ELT2 in the first direction DR1 and may be electrically connected between the first and second electrodes ELT1 and ELT2.

Although FIG. 9 illustrates that all of the light emitting diodes LD are uniformly aligned in the first direction DR1, the disclosure is not limited thereto. For example, at least one of the light emitting diodes LD is arranged in an oblique direction inclined with respect to the first and second directions DR1 and DR2 between the first and second electrodes ELT1 and ELT2.

According to an embodiment, each of the light emitting diodes LD may be a light emitting diode of an ultra-small size, such as a nanoscale to a microscale size, using a material having an inorganic crystal structure, but the disclosure is not limited thereto. Each of the light emitting diodes LD may be a rod-shaped light emitting diode as illustrated in FIGS. 1, 2A, and 2B, but the disclosure is not limited thereto.

Each of the light emitting diodes LD may include a first end EP1 and a second end EP2. The first end EP1 may be disposed adjacent to the first electrode ELT1, and the second end EP2 may be disposed adjacent to the second electrode ELT2. The first end EP1 may or may not overlap the first electrode ELT1. The second end EP2 may or may not overlap the second electrode ELT2.

In an embodiment, the first end EP1 of each of the light emitting diodes LD may be electrically connected to the first electrode ELT1 through the first contact electrode CNE1. In an embodiment, the first end EP1 of each of the light emitting diodes LD may be directly connected to the first electrode ELT1. In an embodiment, the first end EP1 of each of the light emitting diodes LD may be electrically connected only to the first contact electrode CNE1 and may not be electrically connected to the first electrode ELT1. The light emitting diodes LD may be electrically connected to an electrode, a line, or a circuit element through the first contact electrode CNE1.

Similarly, the second end EP2 of each of the light emitting diodes LD may be electrically connected to the second electrode ELT2 through the second contact electrode CNE2, or may be directly connected to the second electrode ELT2. As another example, the second end EP2 of each of the light emitting diodes LD may be electrically connected only to the second contact electrode CNE2 and may not be electrically connected to the second electrode ELT2. The light emitting diodes LD may be electrically connected to an electrode, a line, or a circuit element through the second contact electrode CNE2.

The light emitting diodes LD may be prepared to be dispersed in a solution and may be supplied to each emission area EA by an inkjet method or a slit coating method. In case that alignment signals are applied to the first and second electrodes ELT1 and ELT2 (or the first and second alignment lines) of the pixels PXL in a state in which the light emitting diodes LD are supplied to the light emitting area EA, an electric field is formed between the first and second electrodes ELT1 and ELT2, so that the light emitting diodes LD are aligned. After the light emitting diodes LD are aligned, a solvent may be removed by a drying process or the like.

The first contact electrode CNE1 and the second contact electrode CNE2 may be formed on the first ends EP1 and the second ends EP2 of the light emitting diodes LD, respectively.

The first contact electrode CNE1 may be disposed on the first ends EP1 so as to be electrically connected to the first ends EP1 of the light emitting diodes LD. The first contact electrode CNE1 may be disposed on the first electrode ELT1 and electrically connected to the first electrode ELT1.

The second contact electrode CNE2 may be disposed on the second ends EP2 so as to be electrically connected to the second ends EP2 of the light emitting diodes LD. The second contact electrode CNE2 may be disposed on the second electrode ELT2 and electrically connected to the second electrode ELT2.

The bank BNK may be disposed around the emission area EA so as to surround the emission area EA of each pixel PXL. For example, the bank BNK may be disposed in the outer portion of each pixel area PXA and/or the portion between the adjacent pixel areas PXA so as to surround each emission area EA. For example, the bank BNK may include a first opening OPA1 corresponding to the emission area EA of each pixel PXL and may have a mesh shape over the entire display area DA.

In an embodiment, the bank BNK may further include a second opening OPA2 corresponding to the separation area SPA between the adjacent pixels PXL in the first direction DR1 and/or the second direction DR2. Therefore, the first and second alignment lines may be easily and electrically disconnected in the separation area SPA, and thus the first and second alignment lines may be separated into the first and second electrodes ELT1 and ELT2 of each pixel PXL.

The bank BNK may or may not partially overlap the first and/or second electrodes ELT1 and ELT2. For example, the first and/or second electrodes ELT1 and ELT2 may extend to the non-emission area NEA in which the bank BNK is formed, or may be cut off in the emission area EA.

The bank BNK may or may not overlap the first and/or second contact holes CH1 and CH2. For example, the first and/or second contact holes CH1 and CH2 may be formed in the non-emission area NEA or may be formed in the emission area EA or the separation area SPA.

The bank BNK may include at least one light blocking material and/or at least one reflective material, thereby preventing light leakage between the adjacent pixels PXL. For example, the bank BNK may include at least one black matrix material and/or a color filter material of a specific color.

In the step of supplying the light emitting diodes LD to each pixel PXL, the bank BNK may define each emission area EA to which the light emitting diodes LD are to be supplied. For example, since each emission area EA is partitioned by the bank BNK, a desired type and/or amount of light emitting diode ink (e.g., a solution including at least one type of light emitting diode LD) may be supplied.

Figure 10A:
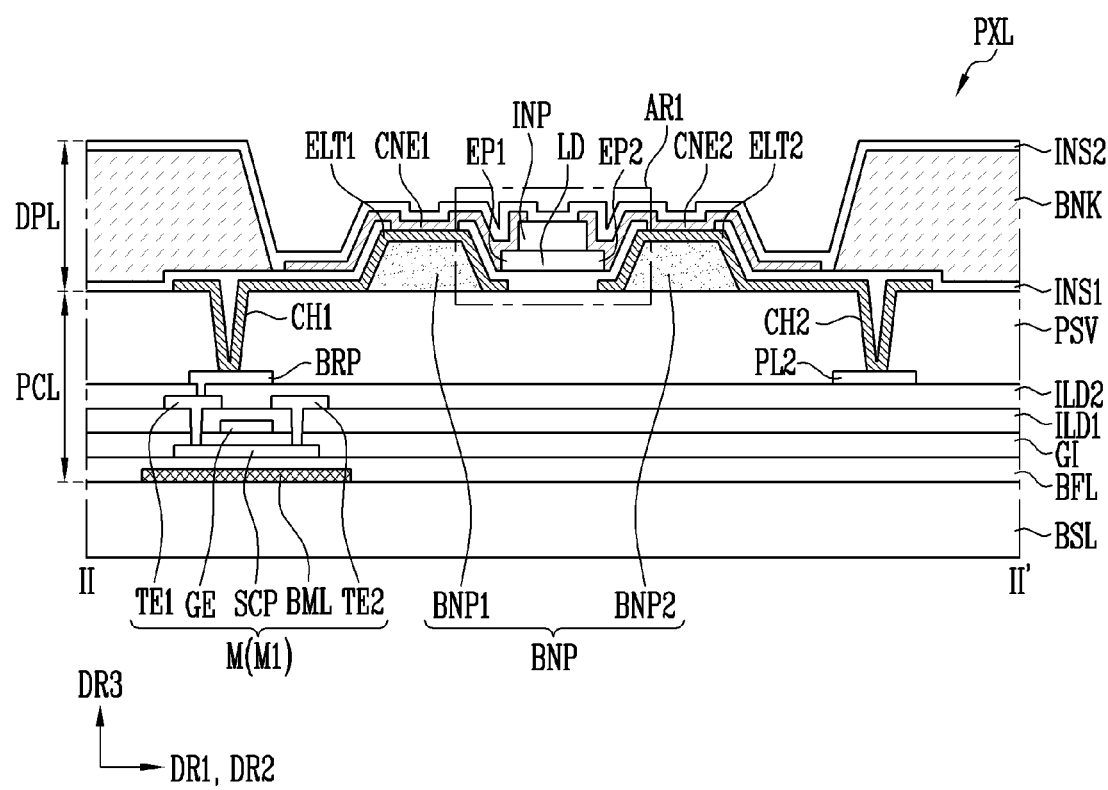
FIGS. 10A and 10B are cross-sectional views schematically illustrating a pixel according to an embodiment of the disclosure.
Figure 10B:
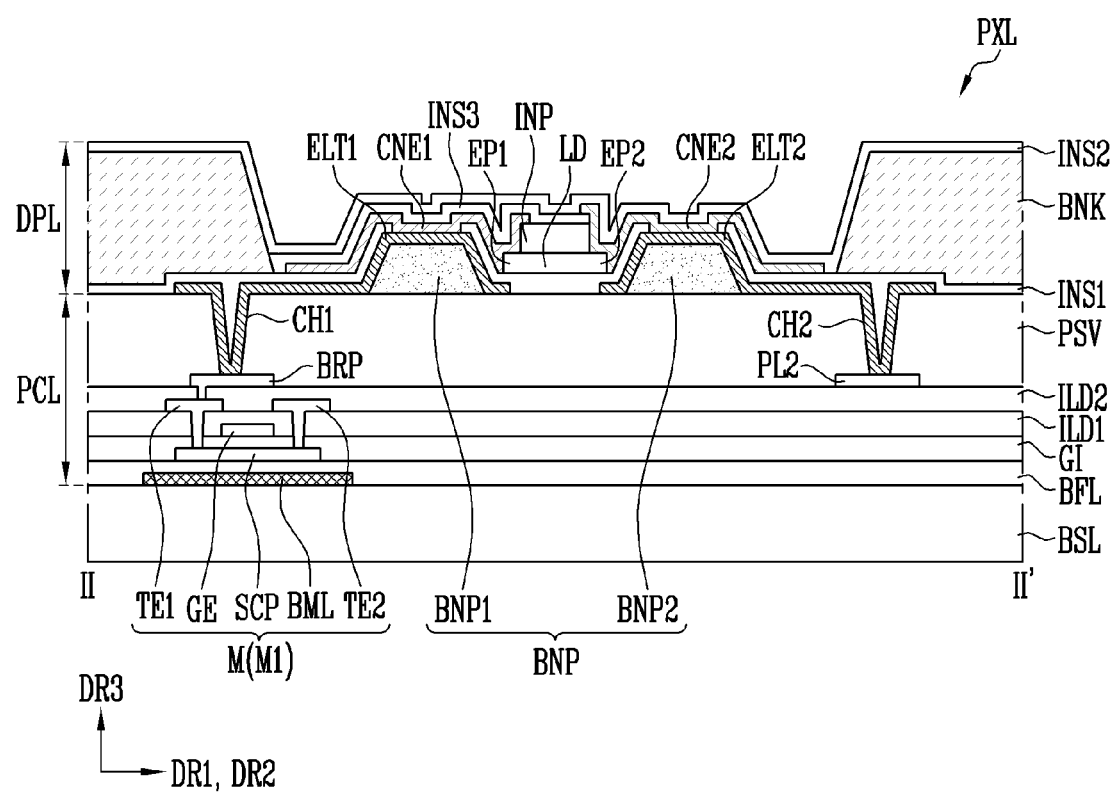

FIGS. 10A and 10B are schematic cross-sectional views illustrating a pixel PXL according to an embodiment. For example, FIGS. 10A and 10B illustrate different embodiments of the cross-section of the pixel PXL taken along line II-II' of FIG. 9. Compared with the embodiment of FIG. 10A, the embodiment of FIG. 10B further includes a third insulating layer INS3 disposed between a first contact electrode CNE1 and a second contact electrode CNE2.

FIGS. 10A and 10B illustrate, as an example of circuit elements that may be disposed in a circuit layer PCL, an arbitrary transistor M (e.g., a first transistor M1 electrically connected to a first electrode ELT1 through a first contact hole CH1 and a bridge pattern BRP and including a bottom metal layer BML). FIGS. 10A and 10B also illustrate, as an example of a line that may be disposed on (or in) the circuit layer PCL, a second power line PL2 electrically connected to a second electrode ELT2 through a second contact hole CH2.

Referring to FIGS. 7 to 10B, the pixel PXL and the display panel DP including the same may include a circuit layer PCL and a display layer DPL provided on a surface of the base layer BSL. For example, the display area DA may include the circuit layer PCL disposed on the surface of the base layer BSL and the display layer DPL disposed on the circuit layer PCL. However, the positions of the circuit layer PCL and the display layer DPL may be changed according to embodiments.

Circuit elements constituting the pixel circuit PXC of the pixel PXL and various lines electrically connected thereto may be disposed in each pixel area PXA of the circuit layer PCL. First and second electrodes ELT1 and ELT2, light emitting diodes LD, and first and second contact electrodes CNE1 and CNE2, which constitute an emission part EMU of the pixel PXL, may be disposed in each pixel area PXA of the display layer DPL.

The circuit layer PCL may include insulating layers in addition to the circuit elements and the lines. For example, the circuit layer PCL may include a buffer layer BFL, a gate insulating layer GI, a first interlayer insulating layer ILD1, a second interlayer insulating layer ILD2, and/or a passivation layer PSV, which are sequentially disposed on the surface of the base layer BSL.

The circuit layer PCL may optionally further include a first conductive layer including a bottom metal layer BML or the like.

For example, the first conductive layer may be disposed between the base layer BSL and the buffer layer BFL and may include a bottom metal layer BML overlapping the gate electrode GE and/or the semiconductor pattern SCP of the first transistor M1. In an embodiment, the bottom metal layer BML may be electrically connected to an electrode of the first transistor M1 (e.g., a source electrode or a drain electrode).

The buffer layer BFL may be disposed on a surface of the base layer BSL including the first conductive layer. The buffer layer BFL may prevent impurities from diffusing into each circuit element.

A semiconductor layer may be disposed on the buffer layer BFL. The semiconductor layer may include a semiconductor pattern SCP of each transistor M. The semiconductor pattern SCP may include a channel region overlapping the gate electrode GE, and first and second conductive regions (e.g., a source region and a drain region) disposed on both sides of the channel region.

The semiconductor pattern SCP may be a semiconductor pattern including polysilicon, amorphous silicon, oxide semiconductor, or the like. The first and second conductive regions of the semiconductor pattern SCP may be doped with different conductivity types.

A gate insulating layer GI may be disposed on the semiconductor layer. A second conductive layer may be disposed on the gate insulating layer GI.

The second conductive layer may include a gate electrode GE of each transistor M. The second conductive layer may further include an electrode of the capacitor Cst and/or a line (e.g., a scan line SL).

The first interlayer insulating layer ILD1 may be disposed on the second conductive layer. A third conductive layer may be disposed on the first interlayer insulating layer ILD1.

The third conductive layer may include first and second transistor electrodes TE1 and TE2 of each transistor M. The first and second transistor electrodes TE1 and TE2 may be source and drain electrodes. The third conductive layer may further include an electrode of the capacitor Cst and/or a line (e.g., a data line DL).

The second interlayer insulating layer ILD2 may be disposed on the third conductive layer. A fourth conductive layer may be disposed on the second interlayer insulating layer ILD2.

Each of the buffer layer BFL, the gate insulating layer GI, the first interlayer insulating layer ILD1, and the second interlayer insulating layer ILD2 may include a single layer or multiple layers and may include at least one inorganic insulating material and/or at least one organic insulating material. For example, each of the buffer layer BFL, the gate insulating layer GI, the first interlayer insulating layer ILD1, and the second interlayer insulating layer ILD2 may include various types of organic/inorganic insulating materials, including silicon nitride ($SiN_x$), silicon oxide ($SiO_x$), or silicon oxynitride ($SiO_xN_y$).

The fourth conductive layer may include a bridge pattern BRP and/or a line (e.g., a first power line PL1 and/or a second power line PL2) electrically connecting the circuit layer PCL to the display layer DPL. The bridge pattern BRP may be electrically connected to the first electrode ELT1 of the emission part EMU through the first contact hole CH1. The second power line PL2 may be electrically connected to the second electrode ELT2 of the emission part EMU through the second contact hole CH2.

Each of the conductive patterns, electrodes, and/or lines constituting (or forming) the first to fourth conductive layers may have conductivity by including at least one conductive material, and the materials thereof are not particularly limited. For example, each of the conductive patterns, electrodes, and/or lines constituting the first to fourth conductive layers may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), but the disclosure is not limited thereto.

A passivation layer PSV may be disposed on the fourth conductive layer. The passivation layer PSV may include at least an organic insulating layer and may substantially planarize the surface of the circuit layer PCL. The display layer DPL may be disposed on the passivation layer PSV.

The passivation layer PSV may include a single layer or multiple layers and may include at least one inorganic insulating material and/or at least one organic insulating material. For example, the passivation layer PSV may include at least one organic insulating layer and may substantially planarize the surface of the circuit layer PCL. In an embodiment, the organic insulating layer may include at least one selected from polyacrylate resin, epoxy resin, phenolic resin, polyamide resin, polyimide resin, unsaturated polyester resin, polyphenylene ether resin, polyphenylene sulfide resin, and benzocyclobutene resin, but the disclosure is not limited thereto.

The display layer DPL may include the emission part EMU of each pixel PXL. For example, the display layer DPL may include first and second electrodes ELT1 and ELT2, light emitting diodes LD, and first and second contact electrodes CNE1 and CNE2, which are disposed in the emission area EA of each pixel PXL.

The display layer DPL may further include a bank pattern BNP for protruding a portion of each of the first and second electrodes ELT1 and ELT2 upward, and/or a bank BNK surrounding each emission area EA. The display layer DPL may further include at least one conductive layer and/or at least one insulating layer.

For example, the display layer DPL may include the bank pattern BNP, the first and second electrodes ELT1 and ELT2, a first insulating layer INS1, the bank BNK, the light emitting diodes LD, an insulating pattern INP, the first and second contact electrodes CNE1 and CNE2, and a second insulating layer INS2, which are sequentially formed on the circuit layer PCL.

In an embodiment, the first and second contact electrodes CNE1 and CNE2 may be disposed in a same layer as illustrated in FIG. 10A. In an embodiment, the first and second contact electrodes CNE1 and CNE2 may be separated and disposed on different layers as illustrated in FIG. 10B. The display layer DPL may further include the third insulating layer INS3 disposed between the first and second contact electrodes CNE1 and CNE2. For example, the third insulating layer INS3 may cover the first contact electrode CNE1, and an end of the third insulating layer INS3 may be disposed between the first contact electrode CNE1 and the second contact electrode CNE2.

A cross-sectional position of the bank BNK may be changed according to embodiments. In an embodiment, the bank BNK may be formed on the first insulating layer INS1. In an embodiment, the bank BNK and the bank pattern BNP may be disposed on a same layer. The bank BNK may be integral or non-integral with the bank pattern BNP and may or may not overlap the bank pattern BNP.

The bank pattern BNP may be optionally formed on a surface of the base layer BSL on which the circuit layer PCL or the like is formed. For example, the bank pattern BNP may protrude from the circuit layer PCL in the height direction of the base layer BSL (e.g., in the third direction DR3). The bank pattern BNP may be disposed under the first and second electrodes ELT1 and ELT2 so as to overlap a portion of each of the first and second electrodes ELT1 and ELT2. Therefore, the first and second electrodes ELT1 and ELT2 may protrude upward in portions overlapping the bank pattern BNP.

The bank pattern BNP forms a reflective wall structure around the light emitting diodes LD and may be formed as a separate or integral pattern. For example, the bank pattern BNP may include a first bank pattern BNP1 and a second bank pattern BNP2 separated from each other. The first bank pattern BNP1 may be disposed under the first electrode ELT1 so as to overlap a portion of the first electrode ELT1, and the second bank pattern BNP2 may be disposed under the second electrode ELT2 to overlap a portion of the second electrode ELT2. In an embodiment, the bank pattern BNP may be formed as an integral bank pattern that has an opening or a groove corresponding to a portion in which the light emitting diodes LD are disposed, and surrounds the portion.

In case that the bank pattern BNP is disposed under a portion of each of the first and second electrodes ELT1 and ELT2, the first and second electrodes ELT1 and ELT2 may protrude upward in a portion in which the bank pattern BNP is formed. Therefore, the bank pattern BNP may form a reflective wall structure together with the first and second electrodes ELT1 and ELT2.

For example, the first and second electrodes ELT1 and ELT2 and/or the bank pattern BNP may be formed of a reflective material, or a reflective layer may be formed on protruding sidewalls of the first and second electrodes ELT1 and ELT2 and/or the bank pattern BNP. Therefore, light emitted from the first and second ends EP1 and EP2 of the light emitting diodes LD facing the first and second electrodes ELT1 and ELT2 may be further guided to direct the front direction of the display panel DP. The front direction of the display panel DP may include a direction perpendicular to the display panel DP (e.g., the third direction DR3), and may also comprehensively refer to a direction that falls within a viewing angle range. As described above, in case that one area of each of the first and second electrodes ELT1 and ELT2 protrudes upward by using the bank pattern BNP, the light efficiency of the pixel PXL may be improved.

In an embodiment, the pixel PXL may not include the bank pattern BNP. The first and second electrodes ELT1 and ELT2 may have a substantially flat surface or may have an uneven surface because the first and second electrodes ELT1 and ELT2 have different thicknesses for each area.

The bank pattern BNP may include an insulating material including at least one inorganic material and/or at least one organic material. For example, the bank pattern BNP may include at least one inorganic film including various inorganic insulating materials such as silicon nitride ($SiN_x$), silicon oxide ($SiO_x$), or silicon oxynitride ($SiO_xN_y$). As another example, the bank pattern BNP may include at least one organic film including various types of organic insulating materials, or may include an insulator of a single layer or multiple layers including a combination of organic/inorganic materials.

The bank pattern BNP may have various shapes. In an embodiment, the bank pattern BNP may have a sidewall inclined at an angle of a certain range with respect to the base layer BSL, as illustrated in FIGS. 10A and 10B. In an embodiment, the sidewall of the bank pattern BNP may have a curved shape or a step shape.

The first and second electrodes ELT1 and ELT2 may be formed on the bank pattern BNP. The first and second electrodes ELT1 and ELT2 may protrude in the height direction of the base layer BSL in an area overlapping the bank pattern BNP.

Each of the first and second electrodes ELT1 and ELT2 may include at least one conductive material. For example, each of the first and second electrodes ELT1 and ELT2 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the at least one metal, a conductive oxide such as indium tin oxide (ITO), indium zinc oxide (IZO), indium tin zinc oxide (ITZO), zinc oxide (ZO), aluminum doped zinc oxide (AZO), gallium doped zinc oxide (GZO), zinc tin oxide (ZTO), gallium tin oxide (GTO), or fluorine doped tin oxide (FTO), and at least one conductive material of conductive polymers such as poly(3,4-ethylenedioxythiophene) (PEDOT), but the disclosure is not limited thereto. For example, each of the first and second electrodes ELT1 and ELT2 may include a carbon nanotube, graphene, or other conductive materials. For example, the first and second electrodes ELT1 and ELT2 may have conductivity by including at least one of various conductive materials, and the materials of the first and second electrodes ELT1 and ELT2 are not particularly limited. The first and second electrodes ELT1 and ELT2 may include conductive materials identical to or different from each other.

Each of the first and second electrodes ELT1 and ELT2 may include a single layer or multiple layers. For example, each of the first and second electrodes ELT1 and ELT2 may include a reflective electrode layer including a reflective conductive material (e.g., a metal). Each of the first and second electrodes ELT1 and ELT2 may optionally further include at least one selected from a transparent electrode layer disposed above and/or below the reflective electrode layer, and a conductive capping layer covering an upper portion of the reflective electrode layer and/or the transparent electrode layer.

The first insulating layer INS1 may be formed on the first and second electrodes ELT1 and ELT2. For example, the first insulating layer INS1 may cover (or overlap) a portion of each of the first and second electrodes ELT1 and ELT2 and may include an opening exposing another portion of each of the first and second electrodes ELT1 and ELT2. For example, the first insulating layer INS1 may include openings formed on the upper surface of the bank pattern BNP. In an embodiment, the first insulating layer INS1 may include contact holes for electrically connecting the first and second electrodes ELT1 and ELT2 to the first and second contact electrodes CNE1 and CNE2, respectively.

The first insulating layer INS1 may include a single layer or multiple layers and may include at least one inorganic insulating material and/or at least one organic insulating material. In an embodiment, the first insulating layer INS1 may include at least one type of inorganic insulating material including silicon nitride ($SiN_x$), silicon oxide ($SiO_x$), or silicon oxynitride ($SiO_xN_y$).

In a portion in which the first insulating layer INS1 is opened (or a portion in which each contact hole is formed in the first insulating layer INS1), the first and second electrodes ELT1 and ELT2 may be electrically connected to the first and second contact electrodes CNE1 and CNE2, respectively.

As the first and second electrodes ELT1 and ELT2 are covered by the first insulating layer INS1, damage to the first and second electrodes ELT1 and ELT2 in a subsequent process may be prevented. It is also possible to prevent short-circuit defects form occurring because the first and second electrodes ELT1 and ELT2 and the light emitting diodes LD are improperly connected.

Light emitting diodes LD may be supplied and aligned in the emission area EA in which the first insulating layer INS1 or the like is formed. Each of the light emitting diodes LD may be aligned between the first electrode ELT1 and the second electrode ELT2.

Prior to supplying the light emitting diodes LD, a bank BNK may be formed around the emission area EA. For example, the bank BNK may be formed in the display area DA to surround each emission area EA. Therefore, each emission area EA to which the light emitting diodes LD are to be supplied may be defined.

An insulating pattern INP may be disposed on portions of the light emitting diodes LD. For example, the insulating pattern INP may be locally disposed on the light emitting diodes LD to expose the first and second ends EP1 and EP2 of each of the light emitting diodes LD.

The insulating pattern INP may include a single layer or multiple layers and may include at least one inorganic insulating material and/or at least one organic insulating material. For example, the insulating pattern INP may include various types of organic/inorganic insulating materials including silicon nitride ($SiN_x$), silicon oxide ($SiO_x$), aluminum oxide ($AlO_x$), and photoresist (PR).

In case that the insulating pattern INP is formed on the light emitting diodes LD after the alignment of the light emitting diodes LD is completed, the light emitting diodes LD may be stably fixed.

In an embodiment, in case that a space is formed between the first insulating layer INS1 and the light emitting diodes LD because of a height difference formed by the first and second electrodes ELT1 and ELT2, the space may be filled with an insulating material introduced in the process of forming the insulating pattern INP. However, according to an embodiment, the space may not be completely filled.

Two ends, for example, the first and second ends EP1 and EP2, of the light emitting diodes LD not covered (or overlapped) by the insulating pattern INP may be covered by the first and second contact electrodes CNE1 and CNE2, respectively.

The first and second contact electrodes CNE1 and CNE2 may be separated from each other. For example, the first and second contact electrodes CNE1 and CNE2 may be spaced apart from each other at the first and second ends EP1 and EP2 of the light emitting diodes LD with the insulating pattern INP therebetween. Therefore, the first and second contact electrodes CNE1 and CNE2 may be electrically connected to the first and second ends EP1 and EP2, respectively.

The first and second contact electrodes CNE1 and CNE2 may be disposed on the first and second electrodes ELT1 and ELT2 to cover the exposed portion of each of the first and second electrodes ELT1 and ELT2. For example, the first and second contact electrodes CNE1 and CNE2 may be disposed on the first and second electrodes ELT1 and ELT2 so as to electrically contact the first and second electrodes ELT1 and ELT2 on or around the bank pattern BNP. Therefore, the first and second contact electrodes CNE1 and CNE2 may be electrically connected to the first and second electrodes ELT1 and ELT2, respectively.

In case that the first and second contact electrodes CNE1 and CNE2 are formed on the same layer as in the embodiment of FIG. 10A, the first and second contact electrodes CNE1 and CNE2 may be formed simultaneously in the same process, or may be formed sequentially, and the third insulating layer INS3 may be omitted. The process of manufacturing the pixels PXL may be simplified.

As in the embodiment of FIG. 10B, in case that the first and second contact electrodes CNE1 and CNE2 are formed on different layers with the third insulating layer INS3 therebetween, the first contact electrode CNE1, the third insulating layer INS3, and the second contact electrode CNE2 may be sequentially formed. The first and second contact electrodes CNE1 and CNE2 may be more stably separated.

The third insulating layer INS3 may include a single layer or multiple layers and may include at least one inorganic insulating material and/or at least one organic insulating material. In an embodiment, the third insulating layer INS3 may include at least one inorganic insulating film including at least one type of inorganic insulating material including silicon nitride ($SiN_x$), silicon oxide ($SiO_x$), or silicon oxynitride ($SiO_xN_y$).

The first and second contact electrodes CNE1 and CNE2 may include various transparent conductive materials. For example, the first and second contact electrodes CNE1 and CNE2 may include at least one of various transparent conductive materials including ITO, IZO, ITZO, ZnO, AZO, GZO, ZTO, GTO, and FTO and may be substantially transparent or translucent to satisfy a predetermined transmittance. Therefore, light emitted from the light emitting diodes LD through the first and second ends EP1 and EP2 may pass through the first and second contact electrodes CNE1 and CNE2 and may be emitted to the outside of the display panel DP.

A second insulating layer INS2 may be disposed on the first and second contact electrodes CNE1 and CNE2. For example, the second insulating layer INS2 may be formed on the entire display area DA so as to cover (or overlap) the bank pattern BNP, the first and second electrodes ELT1 and ELT2, the first insulating layer INS1, the bank BNK, the light emitting diodes LD, the insulating pattern INP, the first and second contact electrodes CNE1 and CNE2, and/or the third insulating layer INS3.

The second insulating layer INS2 may include at least one inorganic and/or organic film. For example, the second insulating layer INS2 may include a single layer or multiple layers and may include at least one inorganic and/or organic insulating material. For example, the second insulating layer INS2 may include various types of organic/inorganic insulating materials including silicon nitride ($SiN_x$), silicon oxide ($SiO_x$), silicon oxynitride ($SiO_xN_y$), or aluminum oxide ($Al_xO_y$).

In an embodiment, the second insulating layer INS2 may include a thin film encapsulation layer having a multilayer structure. For example, the second insulating layer INS2 may be provided as a thin film encapsulation layer having a multilayer structure including at least two inorganic insulating layers and at least one organic insulating layer between the at least two inorganic insulating layers. However, the material and/or structure of the second insulating layer INS2 may be variously changed. According to an embodiment, at least one overcoat layer, at least one filler layer, and/or at least one upper substrate may be further disposed on the second insulating layer INS2.

Figure 11A:
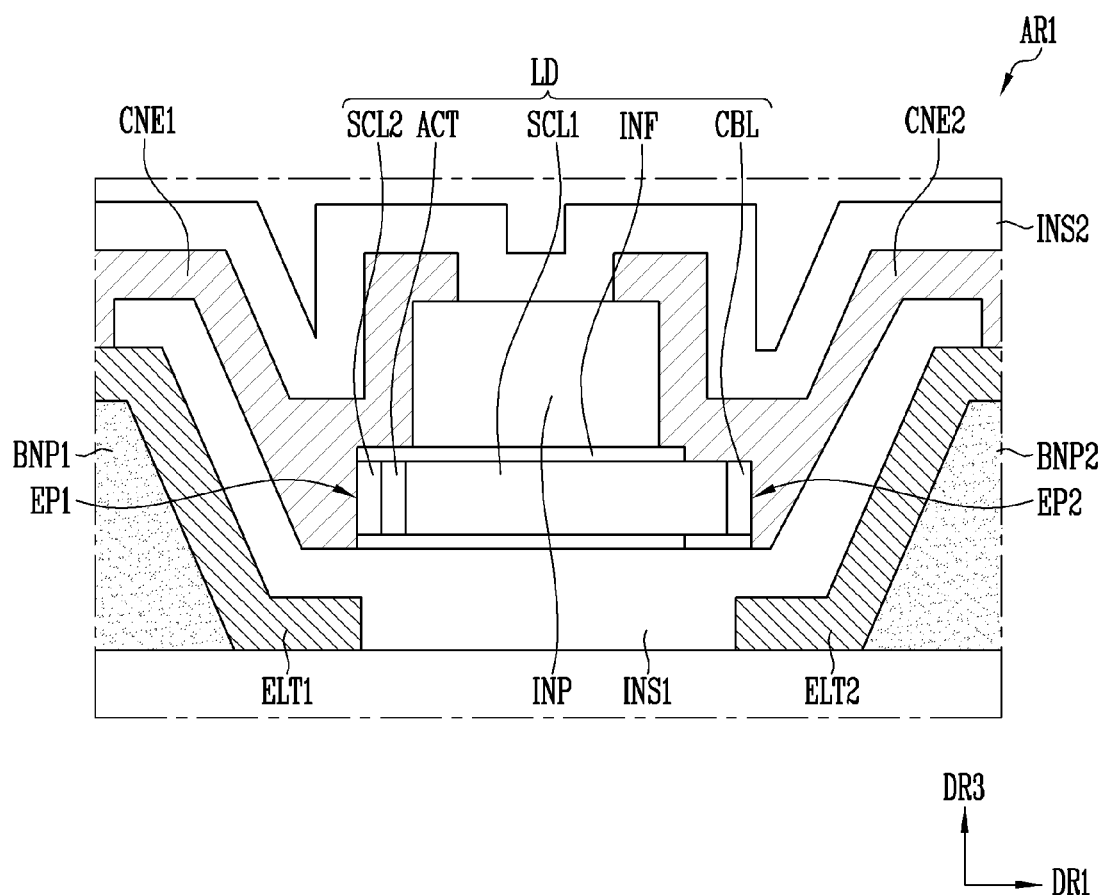
FIGS. 11A and 11B are schematic enlarged cross-sectional views of an area AR1 of FIG. 10A.
Figure 11B:
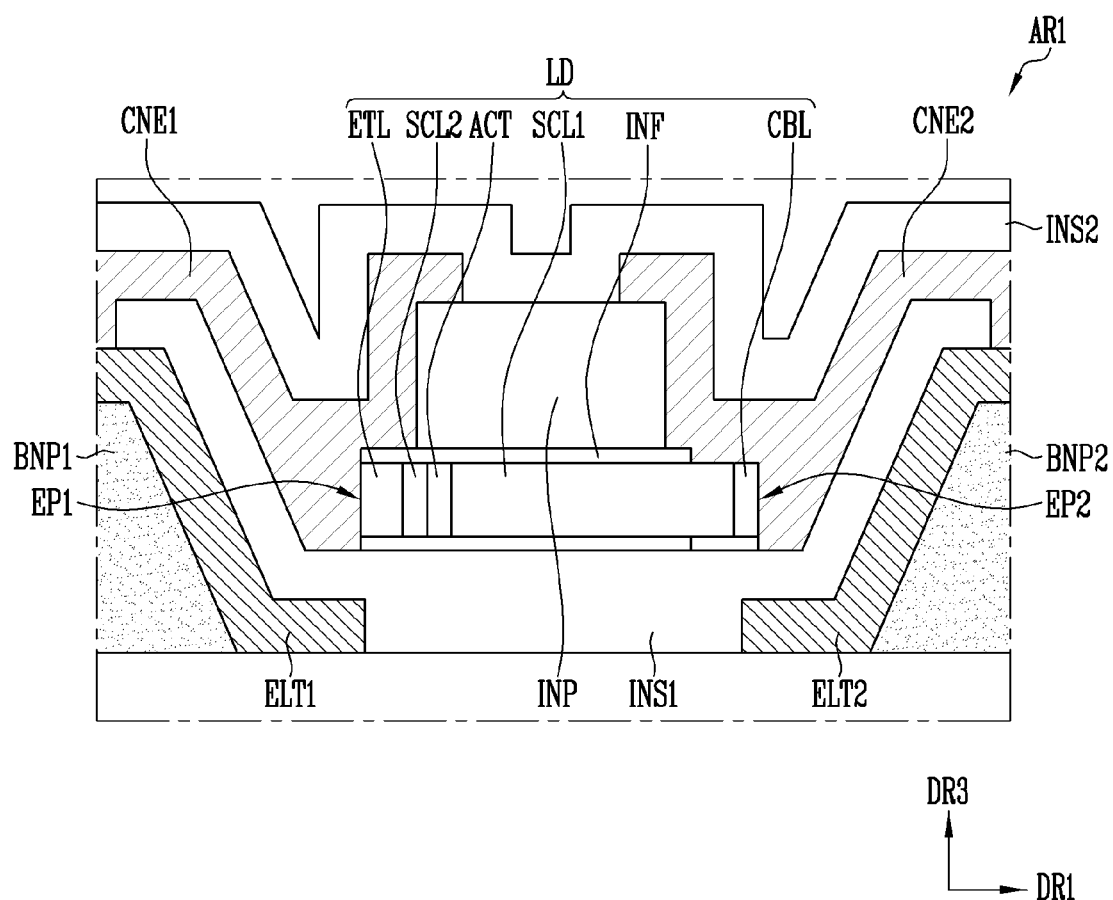

FIGS. 11A and 11B are schematic cross-sectional views in which area AR1 of FIG. 10A is enlarged. For example, FIG. 11A is a schematic enlarged cross-sectional view of a portion (area AR1) of the pixel PXL including the light emitting diode LD according to the embodiments of FIGS. 1 and 2A, and FIG. 11B is a schematic enlarged cross-sectional view of an area (or portion) AR1 of the pixel PXL including the light emitting diode LD according to the embodiments of FIGS. 1 and 2B.

Referring to FIGS. 1 to 11A, the light emitting diode LD includes a current blocking layer CBL, a first semiconductor layer SCL1, an active layer ACT, and a second semiconductor layer SCL2, which are sequentially disposed from the second end EP2 adjacent to the second electrode ELT2 to the first end EP1 adjacent to the first electrode ELT1. The light emitting diode LD further includes an insulating film INF surrounding the outer circumferential surfaces of the first semiconductor layer SCL1, the active layer ACT, and the second semiconductor layer SCL2.

The insulating film INF exposes a portion of the second semiconductor layer SCL2 at the first end EP1. The first contact electrode CNE1 may contact the exposed surface of the second semiconductor layer SCL2 at the first end EP1 of the light emitting diode LD. Therefore, the first contact electrode CNE1 may be electrically connected to the second semiconductor layer SCL2.

The insulating film INF exposes at least a portion of the current blocking layer CBL and at least a portion of the first semiconductor layer SCL1 at the second end EP2. The second contact electrode CNE2 may contact the exposed surface of the first semiconductor layer SCL1 at the second end EP2 of the light emitting diode LD (for example, as the outer circumferential surface of the area immediately adjacent to the current blocking layer CBL, the side circumferential area exposed in a ring shape). Therefore, the second contact electrode CNE2 may be electrically connected to the first semiconductor layer SCL1.

Referring to FIGS. 1 to 11B, the light emitting diode LD may further include an electrode layer ETL positioned at the first end EP1 so as to be adjacent to the second semiconductor layer SCL2, and the insulating film INF may expose at least a portion of the electrode layer ETL at the first end EP1. The first contact electrode CNE1 may contact the exposed surface of the electrode layer ETL at the first end EP1 of the light emitting diode LD. Therefore, the first contact electrode CNE1 may be electrically connected to the electrode layer ETL and the second semiconductor layer SCL2 electrically connected thereto.

According to embodiments, the light emitting diode LD may be separated from the substrate SB by forming the highly doped etching layer ECL between the substrate SB and the light emitting diode LD and etching the etching layer ECL by the electrochemical method.

In particular, according to embodiments, the current blocking layer CBL is formed on the etching layer ECL to limit the etching area, and thus the light emitting diode LD may be stably separated from the substrate SB while damage to the light emitting diode LD is prevented. Therefore, the quality of the light emitting diode LD may be improved, the size thereof may be made uniform, and the separation surface may be planarized.

According to embodiments, the insulating film INF is partially formed on the outer circumferential surface of the light emitting diode LD so as not to cover (or overlap) at least a portion of the first semiconductor layer SCL1 adjacent to the current blocking layer CBL. Therefore, the light emitting diode LD may be easily and electrically connected to the electrode (e.g., the second contact electrode CNE2) through the exposed surface of the first semiconductor layer SCL1 (e.g., the ring-shaped side circumference area).

Effects according to the embodiments are not limited by the above contents presented above, and more various effects are incorporated in the specification.

Although the technical idea of the disclosure has been described in detail according to the above-described embodiments, it should be noted that the above embodiments are for the purpose of explanation and not for the limitation thereof. In addition, those of ordinary skill in the art will appreciate that various modifications can be made thereto within the scope of the technical idea of the disclosure.

Therefore, the scope of the claimed invention should not be limited to the contents described in the detailed description of the specification, but should be determined by the appended claims. In addition, it should be construed that all changes or modifications derived from the meaning and scope of the claims and the equivalent concepts thereof fall within the scope of the disclosure.

What is claimed is:
1. A light emitting diode comprising:
a first end and a second end facing each other;
a current blocking layer;
a first semiconductor layer;
an active layer;
a second semiconductor layer; and
an insulating film surrounding outer circumferential surfaces of the first semiconductor layer, the active layer, and the second semiconductor layer and exposing at least a portion of an outer circumferential surface of the current blocking layer and at least a portion of the outer circumferential surface of the first semiconductor layer at the second end,
wherein the current blocking layer, the first semiconductor layer, the active layer, and the second semiconductor layer are sequentially disposed in a direction from the second end to the first end.

2. The light emitting diode of claim 1, wherein
the first semiconductor layer includes a first conductivity-type semiconductor doped to have a first concentration, and
the current blocking layer includes the first conductivity-type semiconductor doped to have a concentration lower than the first concentration, or includes an undoped intrinsic semiconductor.

3. The light emitting diode of claim 2, wherein the first semiconductor layer and the current blocking layer include a same semiconductor material.

4. The light emitting diode of claim 2, wherein the second semiconductor layer includes a second conductivity-type semiconductor.

5. The light emitting diode of claim 4, wherein
the first semiconductor layer includes an N-type semiconductor, and
the second semiconductor layer includes a P-type semiconductor.

6. The light emitting diode of claim 1, wherein the current blocking layer, the first semiconductor layer, and the second semiconductor layer include a nitride-based semiconductor material.

7. The light emitting diode of claim 1, wherein the current blocking layer includes an insulating material.

8. The light emitting diode of claim 1, further comprising:
an electrode layer disposed at the first end and is adjacent to the second semiconductor layer.

9. The light emitting diode of claim 1, wherein the insulating film exposes the second semiconductor layer or an electrode layer adjacent to the second semiconductor layer at the first end.

10. A light emitting diode comprising:
a first end and a second end facing each other;
a current blocking layer;
a first semiconductor layer;
an active layer;
a second semiconductor layer;
an insulating film surrounding outer circumferential surfaces of the first semiconductor layer, the active layer, and the second semiconductor layer and exposing at least a portion of the current blocking layer and at least a portion of the first semiconductor layer at the second end; and
a rod-shaped light emitting body including the current blocking layer, the first semiconductor layer, the active layer, the second semiconductor layer, and two bottom surfaces corresponding to the first end and the second end, wherein
the current blocking layer, the first semiconductor layer, the active layer, and the second semiconductor layer are sequentially disposed in a direction from the second end to the first end, and the insulating film overlaps a side circumferential area of the light emitting body except for a ring-shaped outer circumferential surface corresponding to at least the portion of the current blocking layer and at least the portion of the first semiconductor layer.

11. A display device comprising:
a pixel disposed in a display area,
wherein the pixel includes:
a first electrode and a second electrode spaced apart from each other;
a light emitting diode disposed between the first electrode and the second electrode, the light emitting diode including:
a current blocking layer;
a first semiconductor layer;
an active layer; and
a second semiconductor layer, wherein the current blocking layer, the first semiconductor layer, the active layer, and the second semiconductor layer are sequentially disposed in a direction from a second end adjacent to the second electrode to a first end adjacent to the first electrode;
a first contact electrode electrically connected to the second semiconductor layer; and
a second contact electrode electrically connected to the first semiconductor layer, wherein
the light emitting diode further includes an insulating film surrounding outer circumferential surfaces of the first semiconductor layer, the active layer, and the second semiconductor layer and exposing at least a portion of an outer circumferential surface of the current blocking layer and at least a portion of the outer circumferential surface of the first semiconductor layer at the second end.

12. The display device of claim 11, wherein the second contact electrode contacts the exposed portion of the outer circumferential surface of the first semiconductor layer and is electrically connected to the first semiconductor layer.

13. The display device of claim 11, wherein
the light emitting diode includes a rod-shaped light emitting body including the current blocking layer, the first semiconductor layer, the active layer, the second semiconductor layer, and two bottom surfaces corresponding to the first end and the second end, and
the insulating film overlaps a side circumferential area of the light emitting body except for a ring-shaped outer circumferential surface corresponding to at least a portion of the current blocking layer and at least a portion of the first semiconductor layer.

14. The display device of claim 11, wherein
the insulating film exposes the second semiconductor layer or an electrode layer adjacent to the second semiconductor layer at the first end, and
the first contact electrode contacts the second semiconductor layer or the exposed surface of the electrode layer at the first end and is electrically connected to the second semiconductor layer.

15. The display device of claim 11, wherein
the first semiconductor layer includes a first conductivity-type semiconductor doped to have a first concentration, and
the current blocking layer includes the first conductivity-type semiconductor doped to have a concentration lower than the first concentration, or includes an undoped intrinsic semiconductor.

16. The display device of claim 15, wherein the second semiconductor layer includes a second conductivity-type semiconductor.

17. The display device of claim 16, wherein
the first semiconductor layer includes an N-type semiconductor, and the second semiconductor layer includes a P-type semiconductor.

18. The display device of claim 11, wherein the current blocking layer, the first semiconductor layer, and the second semiconductor layer include a nitride-based semiconductor material.

19. The display device of claim 11, wherein the current blocking layer includes an insulating material.

* * * * *